(12) United States Patent
Yasuoka et al.

(10) Patent No.: US 7,968,868 B2
(45) Date of Patent: Jun. 28, 2011

(54) OPTICAL SEMICONDUCTOR DEVICE AND MANUFACTURING METHOD OF THE SAME

(75) Inventors: Nami Yasuoka, Kawasaki (JP); Kenichi Kawaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/654,016

(22) Filed: Dec. 8, 2009

(65) Prior Publication Data

US 2010/0090196 A1    Apr. 15, 2010

Related U.S. Application Data

(62) Division of application No. 11/444,420, filed on Jun. 1, 2006, now Pat. No. 7,663,139.

(30) Foreign Application Priority Data

Feb. 22, 2006   (JP) ................................. 2006-045856

(51) Int. Cl.
    *H01L 31/00*    (2006.01)
(52) U.S. Cl. ........................................................ 257/17
(58) Field of Classification Search .................... 257/14, 257/9, 3, 15, 79, 103, 104–105, 113, 120, 257/140, 183, 189, 190, 200, 201, 257, 279, 257/289, 290, 461, 631, 613–615; 438/16, 438/27, 65

See application file for complete search history.

(56) References Cited

U.S. PATENT DOCUMENTS

| 6,573,527 | B1 | 6/2003 | Sugiyama et al. | |
|---|---|---|---|---|
| 2002/0114367 | A1* | 8/2002 | Stintz et al. | 372/45 |
| 2004/0124409 | A1* | 7/2004 | Ebe et al. | 257/14 |
| 2005/0045868 | A1* | 3/2005 | Otsubo et al. | 257/14 |
| 2007/0194299 | A1* | 8/2007 | Yasuoka et al. | 257/17 |

FOREIGN PATENT DOCUMENTS

| JP | 09-326506 | | 12/1997 |
|---|---|---|---|
| JP | 2000/012961 | | 1/2000 |
| JP | 2003-197900 | | 7/2003 |
| JP | 2003197900 | * | 7/2003 |
| JP | 2004-111710 | | 4/2004 |
| JP | 2004111710 | * | 4/2004 |
| JP | 2005-72338 | | 3/2005 |
| JP | 200572338 | * | 3/2005 |

OTHER PUBLICATIONS

Japanese Office Action dated Dec. 14, 2010, with Summary of Office Action in English.

* cited by examiner

*Primary Examiner* — Dao H Nguyen
*Assistant Examiner* — Tram H Nguyen
(74) *Attorney, Agent, or Firm* — Kratz, Quintos & Hanson, LLP

(57) ABSTRACT

A side barrier is provided between columnar dots each constituted by directly stacking respective quantum dots in seven or more layers. Out of respective side barrier layers composing the side barrier, each of the lower side barrier layers (four layers of the undermost layer to the fourth layer from the bottom) is formed as a first side barrier layer into which a tensile strain is introduced, and each of the upper side barrier layers (three layers of the fifth layer to the uppermost layer from the bottom) is formed as a second side barrier layer which has no strain.

2 Claims, 18 Drawing Sheets

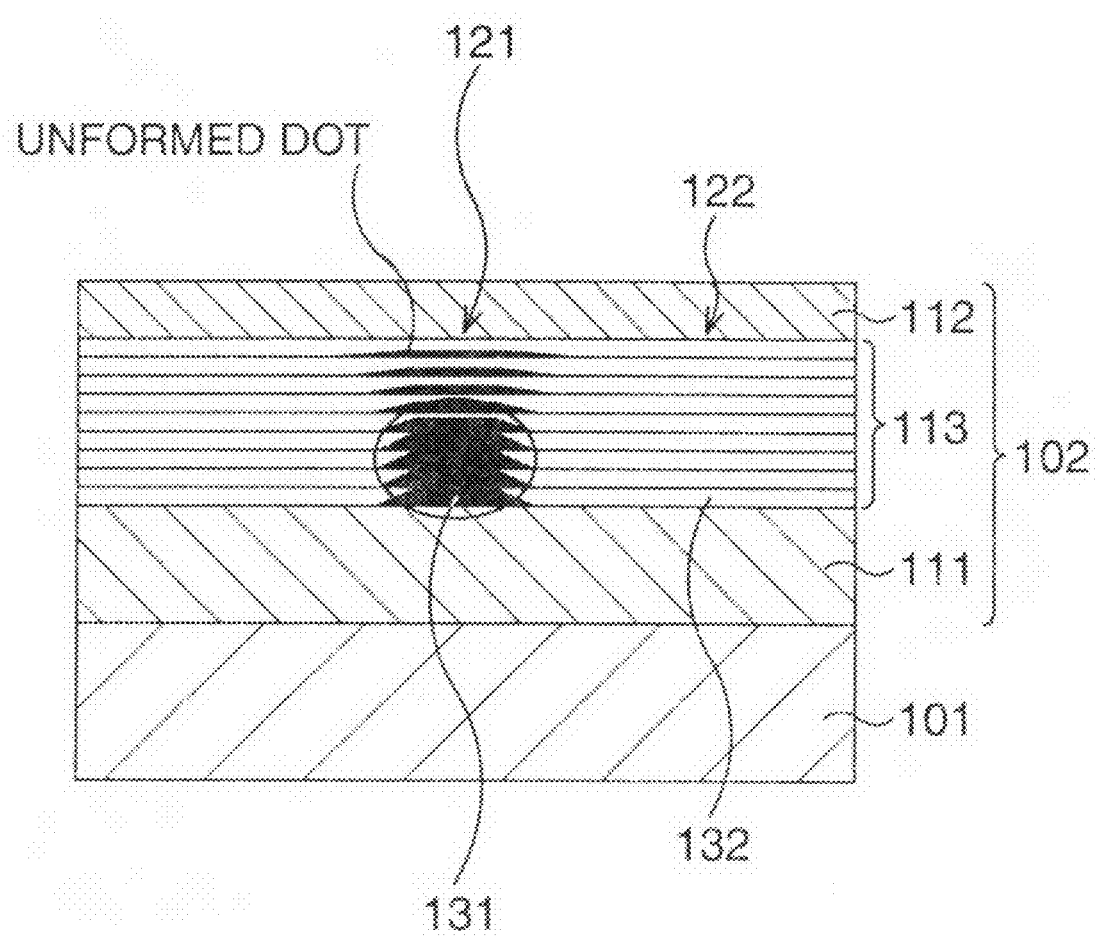

CONSTITUTIONAL EXAMPLE (1)

☐ FIRST SIDE BARRIER LAYER
▨ SECOND SIDE BARRIER LAYER

☐ FIRST SIDE BARRIER LAYER (TENSILE STRAIN)
▨ SECOND SIDE BARRIER LAYER (NO STRAIN)

☐ FIRST SIDE BARRIER LAYER (TENSILE STRAIN)
▨ SECOND SIDE BARRIER LAYER (NO STRAIN)

☐ FIRST SIDE BARRIER LAYER (TENSILE STRAIN)
▨ SECOND SIDE BARRIER LAYER (NO STRAIN)

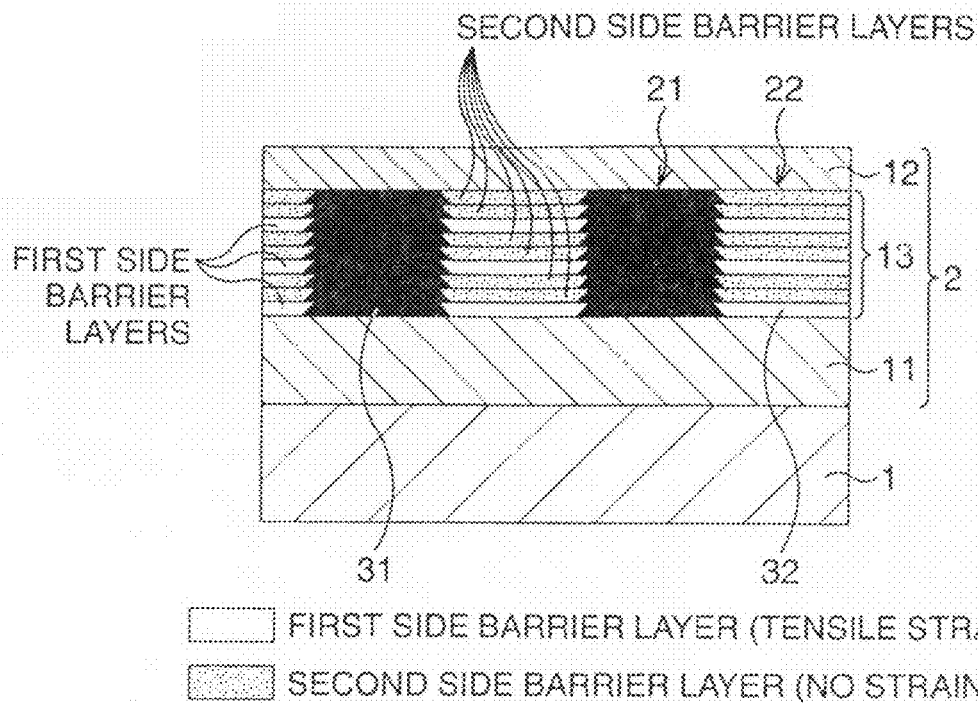
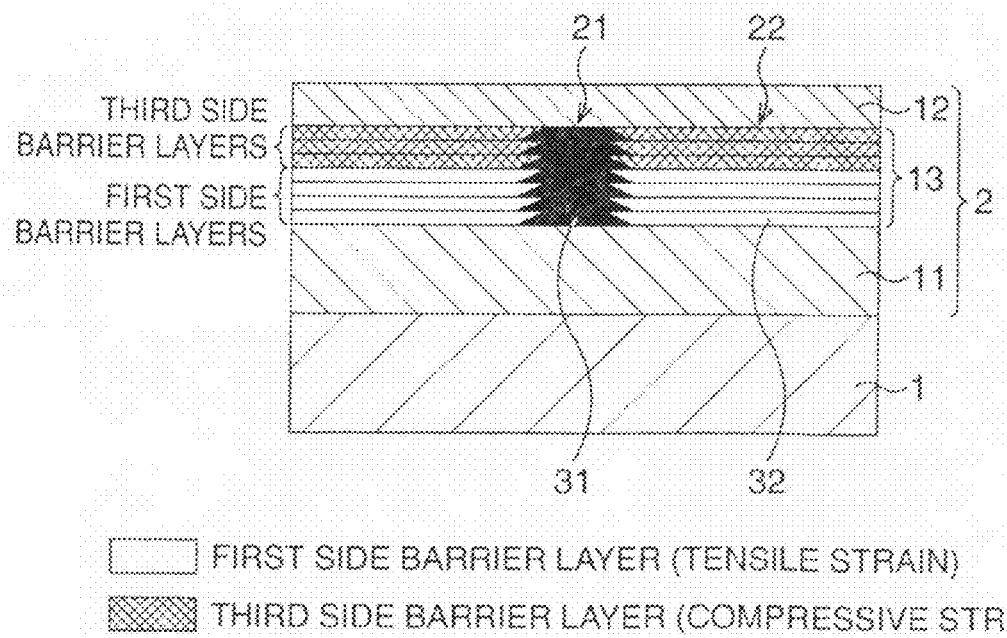

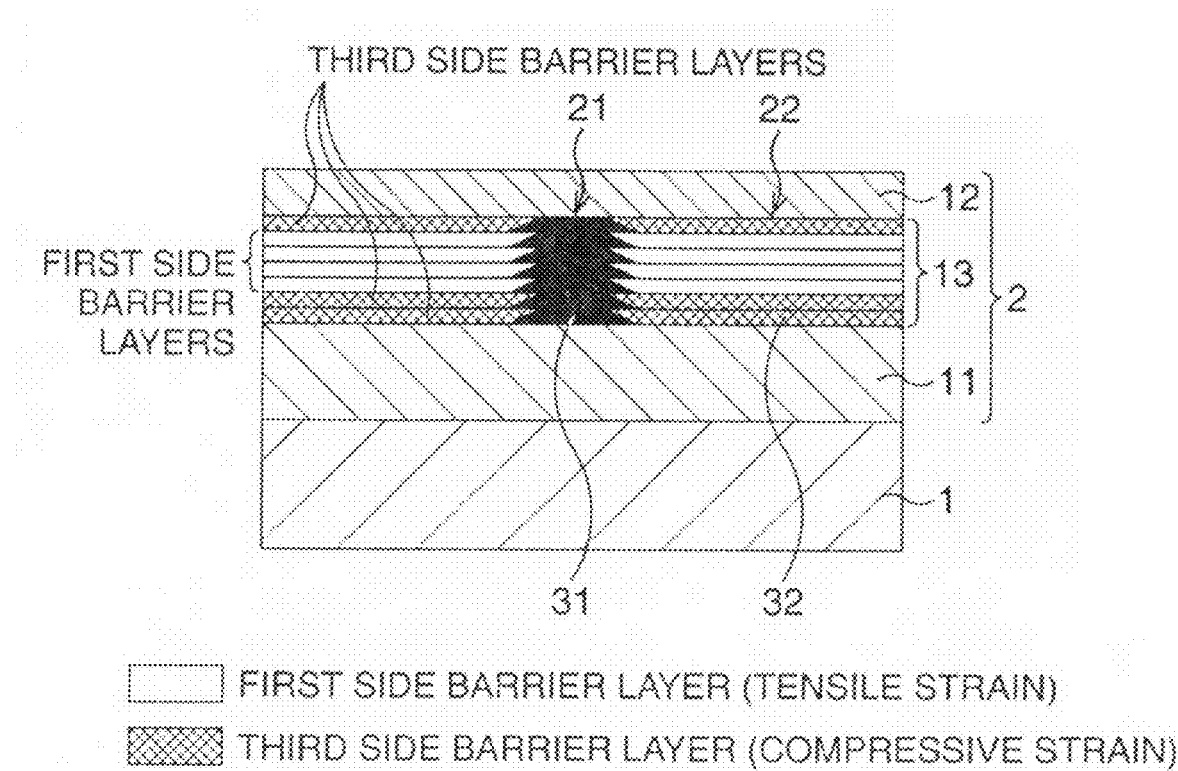

☐ FIRST SIDE BARRIER LAYER (TENSILE STRAIN)
▨ SECOND SIDE BARRIER LAYER (NO STRAIN)

☐ FIRST SIDE BARRIER LAYER (TENSILE STRAIN)
▨ SECOND SIDE BARRIER LAYER (NO STRAIN)

☐ FIRST SIDE BARRIER LAYER (TENSILE STRAIN)
▨ THIRD SIDE BARRIER LAYER (COMPRESSIVE STRAIN)

POLARIZATION DEPENDENCE WITH RESPECT TO NUMBER OF STAKED LAYERS OF DOTS (SIDE BARRIER STRAIN 0%)

POLARIZATION DEPENDENCE WITH RESPECT TO NUMBER OF STAKED LAYERS OF DOTS (SIDE BARRIER STRAIN −0.5%)

OPTICAL SEMICONDUCTOR DEVICE AND MANUFACTURING METHOD OF THE SAME

CROSS-REFERENCE TO RELATED APPLICATIONS

This application is a Divisional Application of prior application Ser. No. 11/444,420, filed on Jun. 1, 2006 now U.S. Pat. No. 7,663,139, which is being hereby incorporated by reference. This application is based upon and claims the benefit of priority from the prior Japanese Patent Application No. 2006-045856, filed on Feb. 22, 2006, the entire contents of which are incorporated herein by reference.

BACKGROUND OF THE INVENTION

1. Field of the Invention

The present invention relates to an optical semiconductor device mainly used for optical communication, and particularly relates to an optical semiconductor device in which quantum dots are used in an active layer.

2. Description of the Related Art

An optical semiconductor device in which quantum dots are used in an active layer enables the realization of a semiconductor element having a small pattern effect and a wide gain band, and therefore its practical use is expected.

It is known that quantum dots can be formed on a substrate in the form of mutually isolated islands by utilizing a so-called S-K (Stranski-Krastanow) mode growth, which appears in the initial phase of heteroepitaxial growth, in a strained heteroepitaxial structure of InAs/GaAs or the like.

An optical amplifier which uses the quantum dots formed by the S-K mode growth has a characteristic of having no gain for so-called TM polarized light and having large polarization dependence. Polarization independence in which the amplification factor of output light is fixed without depending on the polarization state of input light is indispensable for the practical use of the optical amplifier. Therefore, a columnar dot formed by stacking in layers and combining plural quantum dots and combining them into TM mode light is proposed and manufactured by way of trial.

In an optical semiconductor device including columnar dots, an active layer 102 is provided on a semiconductor substrate as shown in FIG. 20. The active layer 102 is constituted by providing a quantum structure 113 between a lower barrier 111 and an upper barrier 112. The quantum structure 113 is composed of columnar dots 121 each formed by stacking in layers, growing, and directly combining plural quantum dots 131 and side barriers 122 each formed by stacking respective side barrier layers 132 corresponding to respective quantum dots 131 so as to be embedded between adjacent columnar dots 121.

In the columnar dot, the luminous efficiency of a TM mode is increased by forming the columnar dot high by increasing the number of stacked layers of quantum dots, thereby obtaining high gain. Namely, in order to increase the luminous intensity ratio of the TM mode, it is necessary to increase the length-to-width ratio of the columnar dot.

However, in the columnar dot, a strain exists therein, and hence there is a problem that by stacking the quantum dots in layers, the crystallinity of the active layer deteriorates and thereby the luminous intensity reduces. For example, in the case of a columnar dot with a size of 20 μm long×15 μm wide, the PL spectral intensity of the columnar dot when the number of stacked layers of quantum dots is 11 (11-fold columnar dot) reduces to about half as compared with a single-layer quantum dot. By increasing the number of stacked layers to obtain a 14-fold columnar dot, polarization independence can be realized. However, in the 14-fold columnar dot, the luminous intensity deteriorates, and thus the level of a crystalline state applicable to the trial manufacture of the optical semiconductor device has not been reached.

Hence, it is required to improve the luminous efficiency of the columnar dot. As a measure against this, there is a method of introducing a tensile strain into the side barrier to relieve the strain accumulated in the columnar dot. It is known that according to this method, the luminous intensity of the TM mode light is increased. It is thought that to realize the polarization-independent optical semiconductor device, it is effective to form the columnar dot by adopting the above-described method.

Patent Document 1

Japanese Patent Application Laid-open No. 2004-111710

Patent Document 2

Japanese Patent Application Laid-open No. 2003-197900

Patent Document 3

Japanese Patent Application Laid-open No. 2005-72338

However, even if the quantum structure in which the tensile strain is introduced into the side barrier is adopted as described above, the following problem arises.

FIG. 21A and FIG. 21B are characteristic charts each showing an evaluation result as a relation between the number of stacked layers of quantum dots in the columnar dot and PL spectral intensity (luminous intensity of TE mode light-luminous intensity of TM mode light; dB) regarding the polarization dependence of the columnar dot. Here, FIG. 21A shows a case where the side barrier has no strain, and FIG. 21B shows a case where a compressive strain of −0.5% (namely, a tensile strain of 0.5%) is introduced into the side barrier, and FIG. 21A and FIG. 21B both show cases where the wavelengths of output light are 1450 nm, 1500 nm, and 1550 nm, respectively.

As shown in FIG. 21A and FIG. 21B, it is found that if the number of stacked layers of quantum dots in the columnar dot is increased, the luminous intensity of the TM mode light gradually increases. Here, as in FIG. 21A, in the columnar dot when the side barrier has no strain, the luminous intensity of the TM mode light increases by about 1 db every time the number of stacked layers of quantum dots increases by one. As in FIG. 21B, as concerns the effect of the introduction of the strain into the side barrier, the luminance intensity of the TM mode light increases by about 2 dB when there is a strain of −0.5% in the 7-fold columnar dot.

However, as shown in FIG. 21B, in the columnar dot when the strain is introduced into the side barrier, there is a problem that even if the length-to-width ratio is increased by increasing the number of stacked layers, the increasing rate of the luminous intensity of the TM mode light is small so that a target set value cannot be obtained. As compared to FIG. 21A, the increasing rate of the luminous intensity of the TM mode light is about ¼.

SUMMARY OF THE INVENTION

The present invention is made in view of the above-described problem, and its object is to provide a highly reliable optical semiconductor device which easily and certainly enables optical amplification with a high luminous intensity of TM mode light and no polarization dependence, and a manufacturing method of the same.

An optical semiconductor device of the present invention is an optical semiconductor device, comprising: a semiconductor substrate; and an active layer including a quantum structure, which is formed on the semiconductor substrate, wherein the quantum structure comprises: a columnar dot which is formed by stacking in layers, growing, and directly combining a plurality of quantum dots; and a side barrier which is formed by stacking respective side barrier layers corresponding to the respective quantum dots so as to be embedded between the columnar dots adjacent to each other, and the side barrier is formed so that part of a plurality of the side barrier layers is a first side barrier layer having a lattice constant smaller than a lattice constant of the semiconductor substrate and the remainder thereof is a second side barrier layer having the same lattice constant as the lattice constant of the semiconductor substrate.

Another aspect of the optical semiconductor device of the present invention is an optical semiconductor device, comprising: a semiconductor substrate; and an active layer including a quantum structure, which is formed on the semiconductor substrate, wherein the quantum structure comprises: a columnar dot which is formed by stacking in layers, growing, and directly combining a plurality of quantum dots; and a side barrier which is formed by stacking respective side barrier layers corresponding to the respective quantum dots so as to be embedded between the columnar dots adjacent to each other, and the side barrier is formed so that part of a plurality of the side barrier layers is a first side barrier layer having a lattice constant smaller than a lattice constant of the semiconductor substrate and the other part is a third side barrier layer having a lattice constant larger than the lattice constant of the semiconductor substrate.

A manufacturing method of an optical semiconductor device of the present invention is a manufacturing method of an optical semiconductor device which comprises: a semiconductor substrate; and an active layer including a quantum structure, which is formed on the semiconductor substrate, the manufacturing method of the optical semiconductor device, comprising: when the quantum structure is formed, a first step of forming a quantum dot; and second step of forming a side barrier layer so as to be embedded between the quantum dots, wherein by performing a series of steps composed of the first step and the second step repeatedly a plurality of times, a columnar dot constituted by stacking in layers, growing, and directly combining a plurality of the quantum dots is formed, and a side barrier constituted by stacking the respective side barrier layers corresponding to the respective quantum dots so as to be embedded between the columnar dots adjacent to each other is formed, and the side barrier is formed so that part of a plurality of the side barrier layers is a first side barrier layer having a lattice constant smaller than a lattice constant of the semiconductor substrate and the remainder thereof is a second side barrier layer having the same lattice constant as the lattice constant of the semiconductor substrate.

Another aspect of the manufacturing method of the optical semiconductor device of the present invention is a manufacturing method of an optical semiconductor device which comprises: a semiconductor substrate; and an active layer including a quantum structure, which is formed on the semiconductor substrate, the manufacturing method of the optical semiconductor device, comprising: when the quantum structure is formed, a first step of forming a quantum dot; and second step of forming a side barrier layer so as to be embedded between the quantum dots, wherein by performing a series of steps composed of the first step and the second step repeatedly a plurality of times, a columnar dot constituted by stacking in layers, growing, and directly combining a plurality of the quantum dots is formed, and a side barrier constituted by stacking the respective side barrier layers corresponding to the respective quantum dots so as to be embedded between the columnar dots adjacent to each other is formed, and the side barrier is formed so that part of a plurality of the side barrier layers is a first side barrier layer having a lattice constant smaller than a lattice constant of the semiconductor substrate and the remainder thereof is a third side barrier layer having a lattice constant larger than the lattice constant of the semiconductor substrate.

BRIEF DESCRIPTION OF THE DRAWINGS

FIG. 1 is a schematic sectional view showing an experimental result to analyze problems of a quantum structure in which a tensile strain is introduced into a side barrier;

FIG. 7 is a schematic sectional view showing an active layer formed on a semiconductor substrate regarding an optical semiconductor device of a constitutional example (5) in the basic constitution 1;

FIG. 8 is a schematic sectional view showing an active layer formed on a semiconductor substrate regarding an optical semiconductor device of a constitutional example (1) in a basic constitution 2;

FIG. 9 is a schematic sectional view showing an active layer formed on a semiconductor substrate regarding an optical semiconductor device of a constitutional example (2) in the basic constitution 2;

DETAILED DESCRIPTION OF THE PREFERRED EMBODIMENTS

Basic Gist of the Present Invention

To attain optical amplification with a high luminous intensity of TM mode light and no polarization dependence, the present inventor tried to find the cause of a low increasing rate of the luminous intensity of the TM mode light even if the number of staked layers of a columnar dot is increased when a quantum structure in which a tensile strain is introduced into a side barrier is adopted.

More specifically, the quantum structure in which the tensile strain is introduced into the side barrier is investigated by evaluating TE, TM, and weak-excitation PL spectral intensities. As a result, it turns out that as shown in FIG. 1, if the number of stacked layers of quantum dots in the columnar dot increases, the tensile strain is accumulated in the side barrier, and consequently, the quantum dots become unformed without being directly stacked in layers on top of each other, so that a desired columnar dot corresponding to the number of stacked layers (here, 7-fold columnar dot) cannot be formed.

Figure 2A:
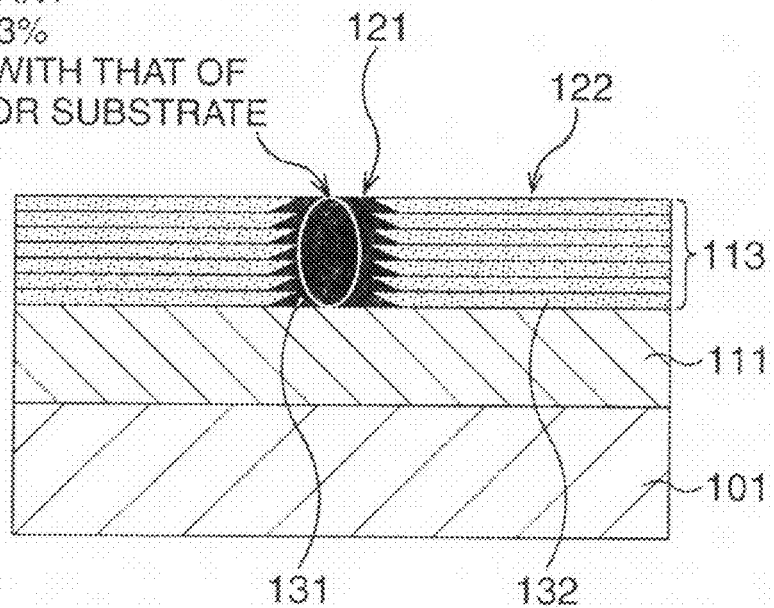
FIG. 2A and FIG. 2B are schematic sectional views showing simulation results to analyze the problems of the quantum structure in which the tensile strain is introduced into the side barrier.
Figure 2B:
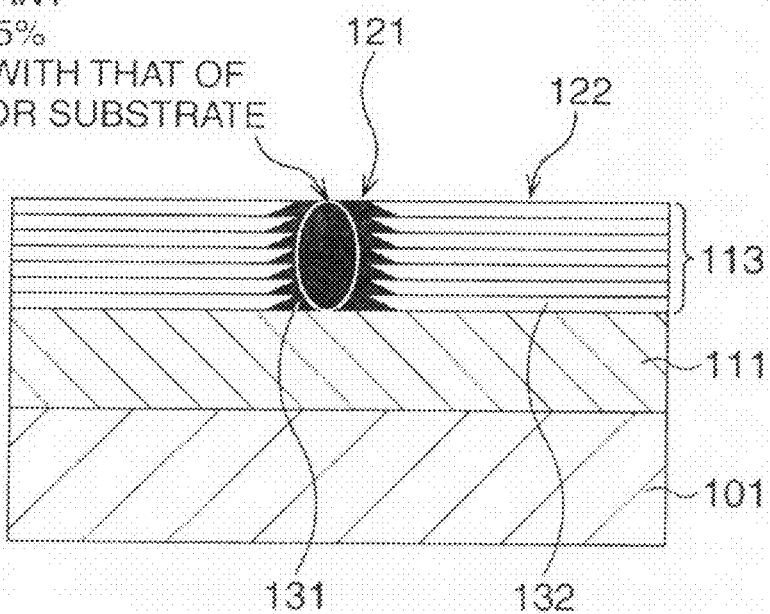
Figure 21A:
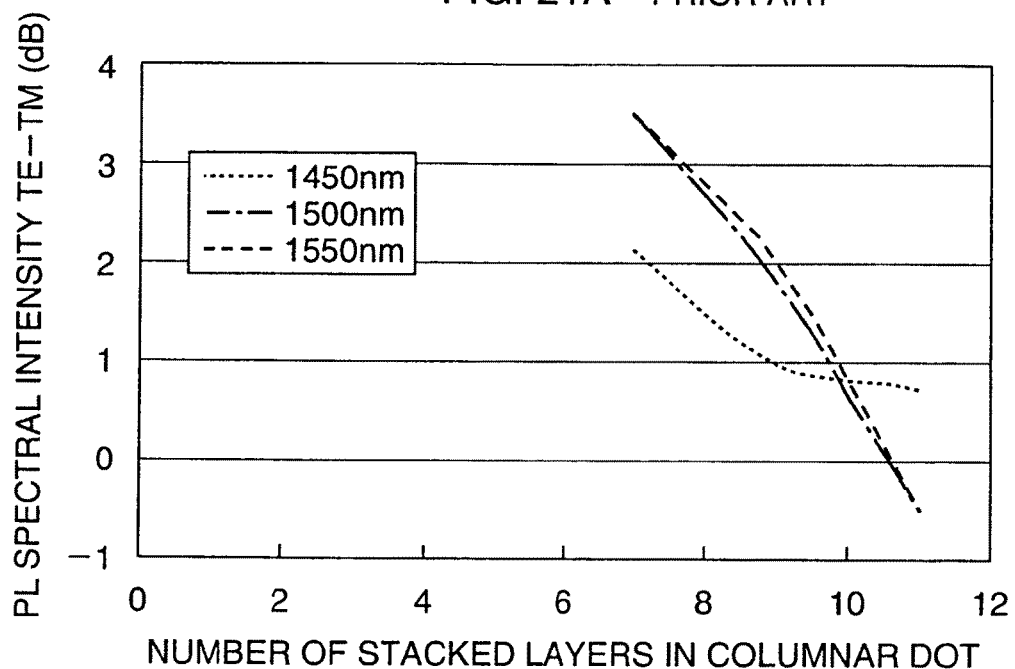
FIG. 21A and FIG. 21B are characteristic charts showing investigation results of polarization dependence of the conventional columnar dot.
Figure 21B:
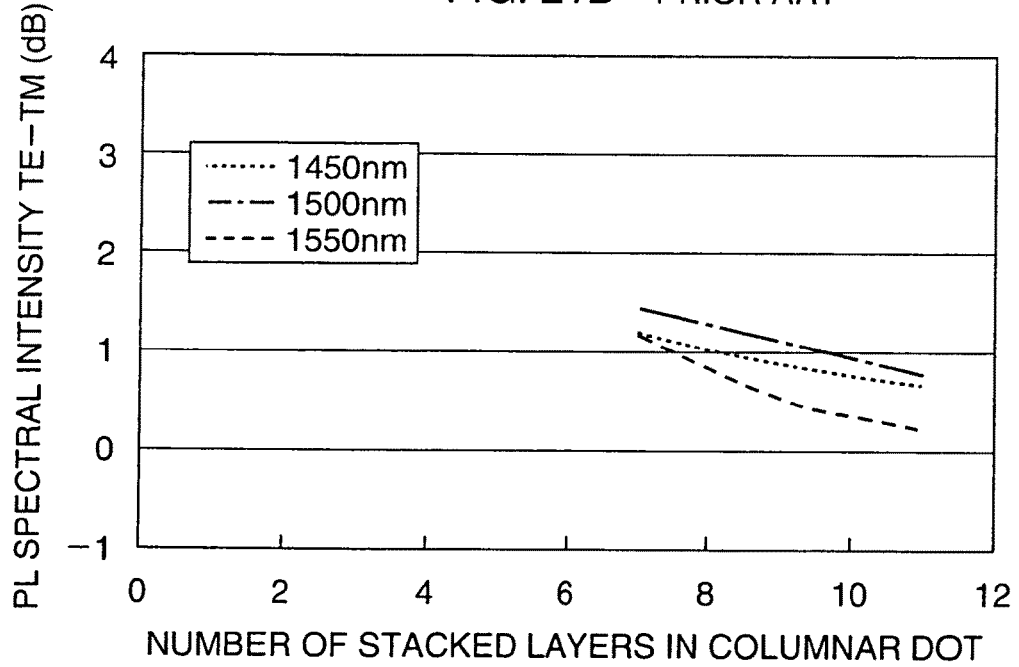

For more detailed investigation, the present inventor performs simulations. FIG. 2A and FIG. 2B show results thereof. For convenience, the same numerals as those in FIG. 21A and FIG. 21B are used. FIG. 2A shows a case where the side barrier has no strain as in FIG. 21A, and FIG. 2B shows a case where a tensile strain of 0.5% is introduced into the side barrier.

When the side barrier has no strain as shown in FIG. 2A, the lattice constant of the quantum dot of the uppermost layer in the columnar dot increases by about 3% as compared with the lattice constant of the semiconductor substrate. On the other hand, it turns out that when the tensile strain of 0.5% is introduced into the side barrier as shown in FIG. 2B, dependent on this tensile strain, the lattice constant of the quantum dot of the uppermost layer increases by about 5% as compared with the lattice constant of the semiconductor substrate.

From results of the above experiment and simulations, it turns out that if the tensile strain is introduced into the side barrier when the columnar dots is formed by directly stacking the quantum dots in layers, the lattice constants of the quantum dots from the vicinity of the seventh layer increase to a nonnegligible extent, and these quantum dots become unformed. Accordingly, in order to increase the luminous intensity of the TM mode light in the columnar dot, it is necessary to control the strain so that even a 7- or more-fold columnar dot can be formed. In this case, in order to realize a polarization-independent optical semiconductor device, it is necessary to increase the luminous intensity of the TM mode light to a level at which the polarization dependence caused by an optical waveguide structure is cancelled. In an optical waveguide, the TM mode light is more intense than the TE mode light by 2 dB. Therefore, it is required that in the intensity ratio of the TM mode light to the TE mode light, the luminous intensity of the TM mode light is higher than that of the TE mode light by about 2 dB.

[Basic Constitution 1]

As a result of assiduous study based on the above-described facts, in the present invention, a quantum structure, in which a side barrier is composed of plural side barrier layers, part of the plural side barrier layers being first side barrier layers having a lattice constant smaller than that of a semiconductor substrate, that is, into which a tensile strain is introduced, and the others being second side barrier layers having the same lattice constant as that of the semiconductor substrate, that is, having not strain, is defined as a basic constitution.

In the present invention, by using the fact that the side barrier is formed by stacking respective side barrier layers corresponding to respective quantum dots so as to be embedded between adjacent columnar dots, in introducing the tensile strain into the side barrier, part of side barrier layers composing the side barrier are formed in an unstrained state so that quantum dots of layers higher than and including a predetermined layer, for example, seventh and higher numbered layers are directly stacked in the same state as layers thereunder. Namely, each of the side barrier layers composing the side barrier is formed by either the first side barrier layer or the second barrier layer.

Various concrete constitutional examples of the basic constitution 1 will be described below with reference to the drawings.

Constitutional Example (1)

Figure 3:
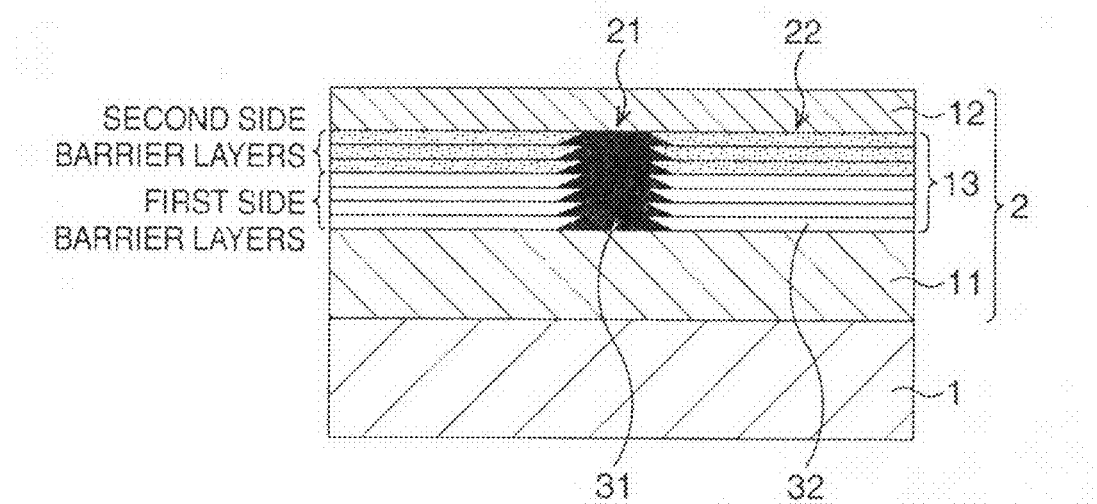
FIG. 3 is a schematic sectional view showing an active layer formed on a semiconductor substrate regarding an optical semiconductor device of a constitutional example (1) in a basic constitution 1.

FIG. 3 is a schematic sectional view showing an active layer formed on a semiconductor substrate regarding an optical semiconductor device of a constitutional example (1) in the basic constitution 1.

In FIG. 3, an active layer 2 is provided on a semiconductor substrate 1. The active layer 2 is constituted by providing a quantum structure 13 between a lower barrier 11 and an upper barrier 12. The quantum structure 13 is composed of a columnar dot 21 which is formed by stacking in layers, growing, and directly combining plural quantum dots 31 and a side barrier 22 which is formed by stacking respective side barrier layers 32 corresponding to the respective quantum dots 31 so as to be embedded between adjacent columnar dots 21.

The columnar dot 21 is constituted by directly stacking the respective quantum dots 31 in seven layers, and its length-to-width dimensional ratio is 0.5 or more and here approximately between 0.6 and 0.8. Correspondingly, the side barrier 22 is constituted by directly stacking the respective side barrier layers 32 in seven layers.

In the constitutional example (1), in order to directly stack all of the quantum dots 31 in a desired state even if the tensile strain is introduced into the side barrier 22, out of the respective side barrier layers 32 composing the side barrier 22, the respective lower side barrier layers (in the example shown, four layers of the undermost layer to the fourth layer from the bottom) are each formed as the first side barrier layer into which the tensile strain is introduced, and the respective upper side barrier layers 32 (in the example shown, three layers of the fifth layer to the uppermost layer from the bottom) are each formed as the second side barrier layer which has no strain.

According to the constitutional example (1), by locally introducing the tensile strain into only the respective lower side barrier layers 32 of the side barrier 22, the strain accumulated in the columnar dot 21 is relieved. Since in each of the upper side barrier layers 32 of the side barrier 22, the tensile strain becomes the main cause of the unformed quantum dot 31, each of the upper side barrier layers 32 is formed to have no strain in order to prevent the unformation of the quantum dot 31. This constitution makes it possible to complete the columnar dot 21 formed by directly stacking all of the quantum dots 31 in a desired state although the strain accumulated in the columnar dot 21 is relieved by the tensile strain in the side barrier 22, thereby realizing a polarization-independent optical amplification characteristic.

Incidentally, in Patent Document 1, a constitution in which a tensile strain is introduced into a side barrier and a compressive strain is introduced into a lower portion and a lower barrier is disclosed. In Patent Document 2, a constitution in which a tensile strain is introduced into a side barrier is disclosed. In Patent Document 3, a constitution in which plural quantum dot stacks (quantum dots are not combined so that a columnar dot is not formed) each of which is formed by stacking quantum dots in layers with a first barrier therebetween are further stacked with a second barrier therebetween is disclosed.

However, each of the inventions in Patent Documents 1 to 3 adopts a constitution in which all of the stacked quantum dots are stacked with the side barrier layer therebetween, so to speak, discretely. In this constitution, in some cases, overlapping of wave functions of the respective quantum dots is small, and in other cases, no overlapping of wave functions occurs, so that polarization independence which does not matter in practical application cannot be obtained.

Contrary to this, in the present invention, on the assumption that the constitution in which the respective quantum dots are directly stacked in layers in order to obtain practical polarization independence is adopted, the constitution in which the side barrier is formed by appropriately stacking the first side barrier layers having the tensile strain and the second side barrier layers having no strain is adopted to increase the luminance intensity of the TM mode light. The above-described effect can be produced first by this constitution, and the present invention is a different invention from the inventions in Patent Documents 1 to 3, and cannot be easily conceived therefrom.

Constitutional Example (2)

Figure 4:
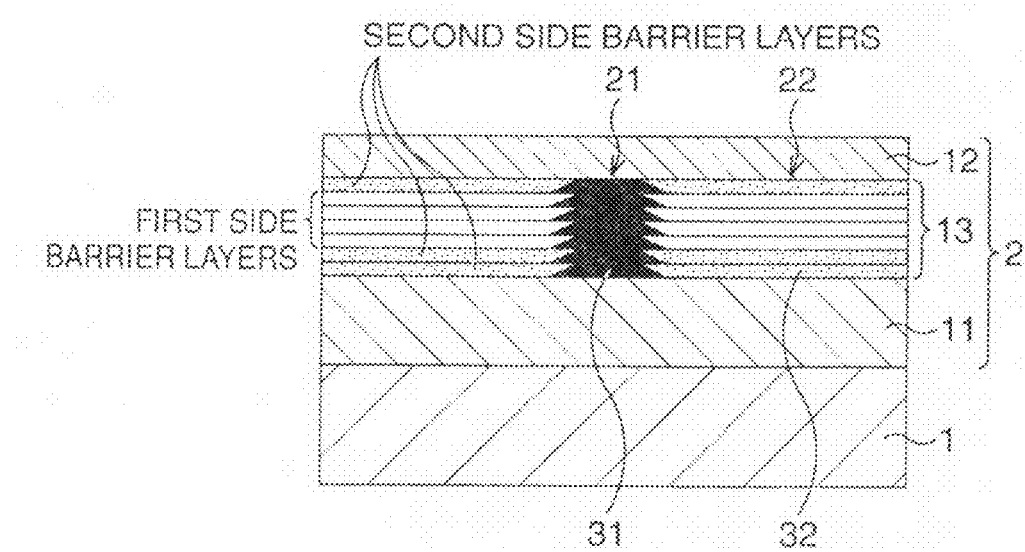
FIG. 4 is a schematic sectional view showing an active layer formed on a semiconductor substrate regarding an optical semiconductor device of a constitutional example (2) in the basic constitution 1.

FIG. 4 is a schematic sectional view showing an active layer formed on a semiconductor substrate regarding an optical semiconductor device of a constitutional example (2) in the basic constitution 1. Incidentally, the same numerals are used to designate the same constituent members as those in FIG. 3 and a detailed explanation thereof will be omitted.

The columnar dot 21 is constituted by directly stacking the respective quantum dots 31 in seven layers, and its length-to-width dimensional ratio is 0.5 or more and here approximately between 0.6 and 0.8. Correspondingly, the side barrier 22 is constituted by directly stacking the respective side barrier layers 32 in seven layers.

In the constitutional example (2), in order to directly stack all of the quantum dots 31 in a desired state even if the tensile strain is introduced into the side barrier 22, out of the respective side barrier layers 32 composing the side barrier 22, four layers of the third layer to the sixth layer from the bottom are each formed as the first side barrier layer into which the tensile strain is introduced, and the other side barrier layers 32 (three layers of the undermost layer to the second layer and the uppermost layer from the bottom) are each formed as the second side barrier layer which has no strain.

According to the constitutional example (2), in order to optimize a portion of the side barrier 22 into which the tensile strain is introduced, the tensile strain is locally introduced into predetermined side barrier layers 32. By adopting this constitution, the effect of pulling the quantum dot by the side barrier layer can be maintained. Namely, the tensile strain becomes larger in a central portion (It is an object of this constitution that the effect of increasing the TM mode luminous intensity by the tensile side barrier is produced remarkably). Since in an upper portion of the side barrier 22, the tensile strain becomes the main cause of the unformed quantum dot 31, to prevent the unformation of the quantum dot 31, the remaining side barrier layers 32 (particularly, the uppermost side barrier layer 32) are formed to have no strain. This constitution makes it possible to complete the columnar dot 21 in a desired state by directly stacking all of the quantum dots 31 although the strain accumulated in the columnar dot 21 is relieved by the tensile strain in the side barrier 22, thereby realizing a polarization-independent optical amplification characteristic.

Constitutional Example (3)

Figure 5:
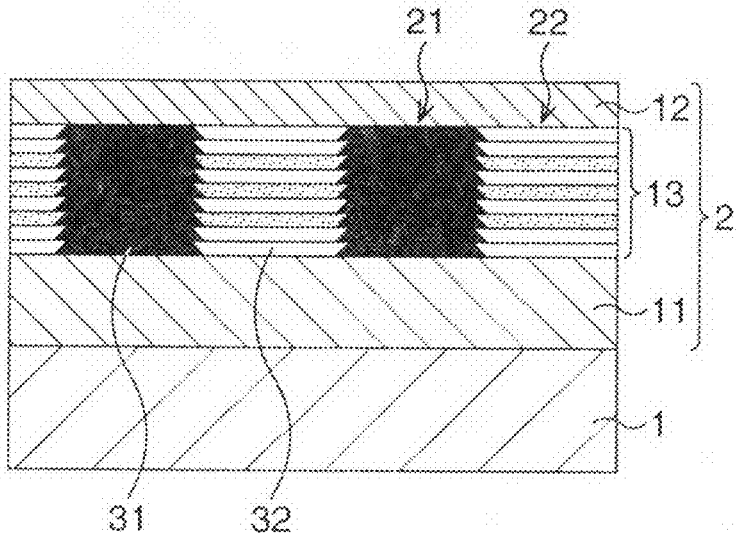
FIG. 5 is a schematic sectional view showing an active layer formed on a semiconductor substrate regarding an optical semiconductor device of a constitutional example (3) in the basic constitution 1.

FIG. 5 is a schematic sectional view showing an active layer formed on a semiconductor substrate regarding an optical semiconductor device of a constitutional example (3) in the basic constitution 1. Incidentally, the same numerals are used to designate the same constituent members as those in FIG. 3 and a detailed explanation thereof will be omitted.

The columnar dot 21 is constituted by directly stacking the respective quantum dots 31 in nine layers, and its length-to-width dimensional ratio is 0.5 or more and here approximately between 0.65 and 0.9. Correspondingly, the side barrier 22 is constituted by directly stacking the respective side barrier layers 32 in nine layers.

In the constitutional example (3), in the side barrier 22, the first side barrier layers and the second side barrier layers are stacked such that the respective second side barrier layers are discretely inserted between the respective first side barrier layers. Namely, here, the strain accumulated in the columnar dot 21 is finely adjusted.

For example, in the side barrier 22, the first side barrier layers and the second side barrier layers are stacked in such a manner that out of the stacked side barrier layers, a lower half portion and an upper half portion have a symmetrical structure with respect to a central portion. To put it in detail, in order to directly stack all of the quantum dots 31 in a desired state even if the tensile strain is introduced into the side barrier 22, out of the respective side barrier layers 32 composing the side barrier 22, in the example shown, six layers of the undermost layer, the second layer, the fourth layer, the sixth layer, the eighth layer, and the uppermost layer from the bottom are each formed as the first side barrier layer into which the tensile strain is introduced, and the other side barrier layers 32 (in the example shown, three layers of the third layer, the fifth layer, and the seventh layer from the bottom) are each formed as the second side barrier layer which has no strain.

In order to relieve a side barrier strain, layers having no strain are discretely inserted. By adopting this constitution, the strain accumulated in the columnar dot can be finely and exactly relieved to a set value. By this constitution, the strain accumulated in the columnar dot 21 is finely and exactly relieved. Since in the upper portion of the side barrier 22, the tensile strain becomes the main cause of the unformed quantum dot 31, to prevent the unformation of the quantum dot 31, the remaining side barrier layers 32 are formed to have no strain. This constitution makes it possible to complete the columnar dot 21 in a desired state by directly stacking all of the quantum dots 31 although the strain accumulated in the columnar dot 21 is relieved by the tensile strain in the side barrier 22, thereby realizing a polarization-independent optical amplification characteristic.

Constitutional Example (4)

Figure 6:
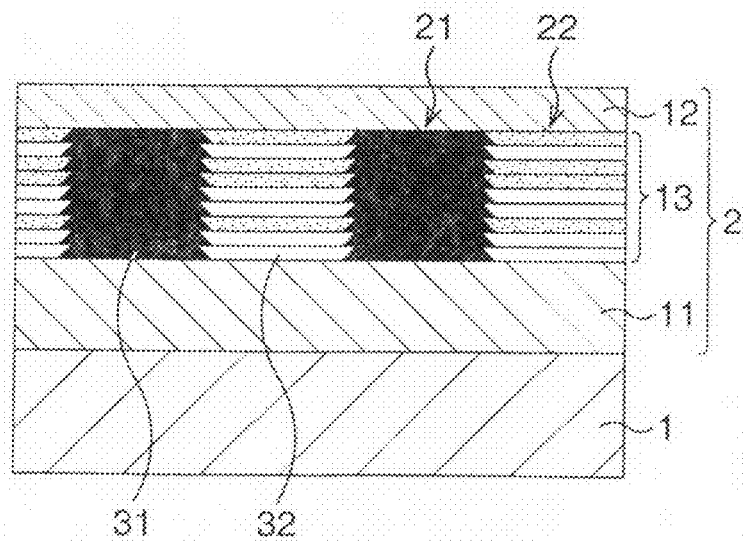
FIG. 6 is a schematic sectional view showing an active layer formed on a semiconductor substrate regarding an optical semiconductor device of constitutional example (4) in the basic constitution 1.

FIG. 6 is a schematic sectional view showing an active layer formed on a semiconductor substrate regarding an optical semiconductor device of a constitutional example (4) in the basic constitution 1. Incidentally, the same numerals are used to designate the same constituent members as those in FIG. 3 and a detailed explanation thereof will be omitted.

The columnar dot 21 is constituted by directly stacking the respective quantum dots 31 in nine layers, and its length-to-width dimensional ratio is 0.5 or more and here approximately between 0.65 and 0.9. Correspondingly, the side barrier 22 is constituted by directly stacking the respective side barrier layers 32 in nine layers.

In the constitutional example (4), the first side barrier layers and the second side barrier layers are stacked such that the ratio of the tensile strain gradually reduces in the upper portion of the side barrier and the tensile strain is effectively uniformly applied to a side surface of the columnar dot 21.

For example, in order to directly stack all of the quantum dots 31 in a desired state even if the tensile strain is introduced into the side barrier 22, the side barrier 22 has a constitution in which the first side barrier layers and the second side barrier layers are stacked appropriately so that the tensile strain is effectively uniformly applied to the side surface of the columnar dot 21. The tensile strain in the side barrier is made large in a lower portion and gradually made smaller so that changes in strain at the side surface of the columnar dot become nearly equal and consequently the strain becomes uniform. To put it in detail, out of the respective side barrier layers 32 composing the side barrier 22, five layers of the undermost layer, the second layer, the fourth layer, the fifth layer, and the eighth layer from the bottom are each formed as the first side barrier layer into which the tensile strain is introduced, and the other side barrier layers 32 (in the example shown, four layers of the third layer, the sixth layer, the seventh layer, and the uppermost layer from the bottom) are each formed as the second side barrier layer which has no strain.

The tensile strain in the side barrier is made large in the lower portion and gradually made smaller so that changes in strain at the side surface of the columnar dot become nearly equal and consequently the strain becomes uniform. By adopting this constitution, the effect of the tensile strain in the upper portion reduces, which makes it possible to create a state in which the quantum dots are directly combined, thereby realizing a polarization-independent optical amplification characteristic.

Constitutional Example (5)

FIG. 7 is a schematic sectional view showing an active layer formed on a semiconductor substrate regarding an optical semiconductor device of a constitutional example (5) in the basic constitution 1. Incidentally, the same numerals are used to designate the same constituent members as those in FIG. 3 and a detailed explanation thereof will be omitted.

The columnar dot 21 is constituted by directly stacking the respective quantum dots 31 in nine layers, and its length-to-width dimensional ratio is 0.5 or more and here approximately between 0.65 and 0.9. Correspondingly, the side barrier 22 is constituted by directly stacking the respective side barrier layers 32 in nine layers.

In the constitutional example (5), in order to directly stack all of the quantum dots 31 in a desired state even if the tensile strain is introduced into the side barrier 22, out of the respective side barrier layers 32 composing the side barrier 22, three layers of the undermost layer, the fourth layer, and the seventh layer from the bottom are each formed as the first side barrier layer into which the tensile strain is introduced. Here, these three first side barrier layers have different amounts of tensile strain, and they are controlled in such a manner that the undermost layer has the strongest tensile strain, and the tensile strain of the fourth and seventh becomes weaker in this order. The other side barrier layers 32 (in the example shown, six layers of the second layer, the third layer, the fifth layer, the sixth layer, the eighth layer, and the uppermost layer from the bottom) are each formed as the second side barrier layer which has no strain.

According to the constitutional example (5), in order to optimize a portion of the side barrier 22 into which the tensile strain is introduced, the tensile strain is locally introduced, here, into the lower several and uppermost side barrier layers 32 while the amount of strain is varied respectively. By this constitution, the strain accumulated in the columnar dot 21 is finely and exactly relieved. Since in the upper portion of the side barrier 22, the tensile strain becomes the main cause of the unformed quantum dot 31, to prevent the unformation of the quantum dot 31, the remaining side barrier layers 32 are formed to have no strain. This constitution makes it possible to complete the columnar dot 21 in a desired state by directly stacking all of the quantum dots 31 although the strain accumulated in the columnar dot 21 is relieved by the tensile strain in the side barrier 22, thereby realizing a polarization-independent optical amplification characteristic.

[Basic Constitution 2]

As a result of study based on the fact that the quantum dot becomes unformed in the upper portion of the side barrier, in the present invention, as another aspect of the present invention, a basic constitution of a quantum structure is conceived, in which a side barrier is composed of plural side barrier layers, part of the plural side barrier layers being first side barrier layers having a lattice constant smaller than that of the semiconductor substrate, that is, into which the tensile strain is introduced, and the others being third side barrier layers having a lattice constant larger than that of the semiconductor substrate, that is, into which a compressive strain is introduced.

In the present invention, by using the fact that the side barrier is formed by stacking respective side barrier layers corresponding to respective quantum dots so as to be embedded between adjacent columnar dots, the tensile strain is introduced into part of side barrier layers composing the side barrier and the compressive strain is introduced into the other side barrier layers so that quantum dots of layers higher than and including a predetermined layer, for example, seventh and higher numbered layers are directly stacked in the same state as layers thereunder. Namely, each of the side barrier layers composing the side barrier is formed by either the first side barrier layer or the third side barrier layer.

Various concrete constitutional examples of a basic constitution 2 will be described below with reference to the drawings.

Constitutional Example (1)

FIG. 8 is a schematic sectional view showing an active layer formed on a semiconductor substrate regarding an optical semiconductor device of a constitutional example (1) in the basic constitution 2. Incidentally, the same numerals are used to designate the same constituent members as those in FIG. 3 and a detailed explanation thereof will be omitted.

The columnar dot 21 is constituted by directly stacking the respective quantum dots 31 in seven layers, and its length-to-width dimensional ratio is 0.5 or more and here approximately between 0.6 and 0.8. Correspondingly, the side barrier 22 is constituted by directly stacking the respective side barrier layers 32 in seven layers.

In the constitutional example (1), in order to directly stack all of the quantum dots 31 in a desired state even if the tensile strain is introduced into the side barrier 22, out of the respective side barrier layers 32 composing the side barrier 22, the respective lower side barrier layers (in the example shown, four layers of the undermost layer to the fourth layer from the bottom) are each formed as the first side barrier layer into which the tensile strain is introduced, and the respective upper side barrier layers 32 (in the example shown, three layers of the fifth layer to the uppermost layer from the bottom) are each formed as the third side barrier layer into which the compressive strain is introduced.

According to the constitutional example (1), by locally introducing the tensile strain into, only the respective lower side barrier layers 32 of the side barrier 22, the strain accumulated in the columnar dot 21 is relieved. Since in each of the upper side barrier layers 32 of the side barrier 22, the tensile strain becomes the main cause of the unformed quantum dot 31, the compressive strain is introduced into the respective upper side barrier layers 32 in order to prevent the unformation of the quantum dot 31. This constitution makes it possible to complete the columnar dot 21 in a desired state by directly stacking all of the quantum dots 31 although the strain accumulated in the columnar dot 21 is relieved by the tensile strain in the side barrier 22, thereby realizing a polarization-independent optical amplification characteristic.

Constitutional Example (2)

FIG. 9 is a schematic sectional view showing an active layer formed on a semiconductor substrate regarding an optical semiconductor device of a constitutional example (2) in the basic constitution 2. Incidentally, the same numerals are used to designate the same constituent members as those in FIG. 3 and a detailed explanation thereof will be omitted.

The columnar dot 21 is constituted by directly stacking the respective quantum dots 31 in seven layers, and its length-to-width dimensional ratio is 0.5 or more and here approximately between 0.6 and 0.8. Correspondingly, the side barrier 22 is constituted by directly stacking the respective side barrier layers 32 in seven layers.

In the constitutional example (2), in order to directly stack all of the quantum dots 31 in a desired state even if the tensile strain is introduced into the side barrier 22, out of the respective side barrier layers 32 composing the side barrier 22, four layers of the third layer to the sixth layer from the bottom are each formed as the first side barrier layer into which the tensile strain is introduced, and the other side barrier layers 32 (three layers of the undermost layer to the second layer and the uppermost layer from the bottom) are each formed as the third side barrier layer into which the compressive strain is introduced.

According to the constitutional example (2), in order to optimize a portion of the side barrier 22 into which the tensile strain is introduced, the tensile strain is locally introduced here into the lower several and uppermost side barrier layers 32. By this constitution, the strain accumulated in the columnar dot 21 is finely and exactly relieved. Since in an upper portion of the side barrier 22, the tensile strain becomes the main cause of the unformed quantum dot 31, to certainly prevent the unformation of the quantum dot 31, the compressive strain is introduced into the remaining side barrier layers 32. This constitution makes it possible to complete the columnar dot 21 in a desired state by directly stacking all of the quantum dots 31 although the strain accumulated in the columnar dot 21 is relieved by the tensile strain in the side barrier 22, thereby realizing a polarization-independent optical amplification characteristic.

VARIOUS PREFERRED EMBODIMENTS TO WHICH THE PRESENT INVENTION IS APPLIED

Various specific preferred embodiments which correspond to the above-described basic constitutions 1 and 2 will be described in detail below with reference to the drawings. In the following respective embodiments, for convenience, the constitution of the optical semiconductor device will be described with a manufacturing method thereof.

First Embodiment

In this embodiment, the optical semiconductor device including the active layer 2 in the constitutional example (1) of the basic constitution 1 will be described.

FIG. 10A to FIG. 12 are schematic sectional views showing a manufacturing method of the optical semiconductor device according to the first embodiment step by step.

FIG. 10A:

First, a buffer layer 11, for example, made of n-InP with a thickness of about 500 nm is formed on a semiconductor substrate 1, for example, made of n-InP, for example, by an MBE method or an MOVPE method.

Then, a stacked structure 10 is formed by stacking a quaternary barrier layer 14 made of InGaAsP, a quantum structure 13, a quaternary barrier layer 14 made of InGaAsP, a quantum structure 13, and a quandary barrier layer 14 made of InGaAsP on the buffer layer 11.

Thereafter, a cladding layer 3 made of p-InP is stacked on the stacked structure 10.

Figure 12:
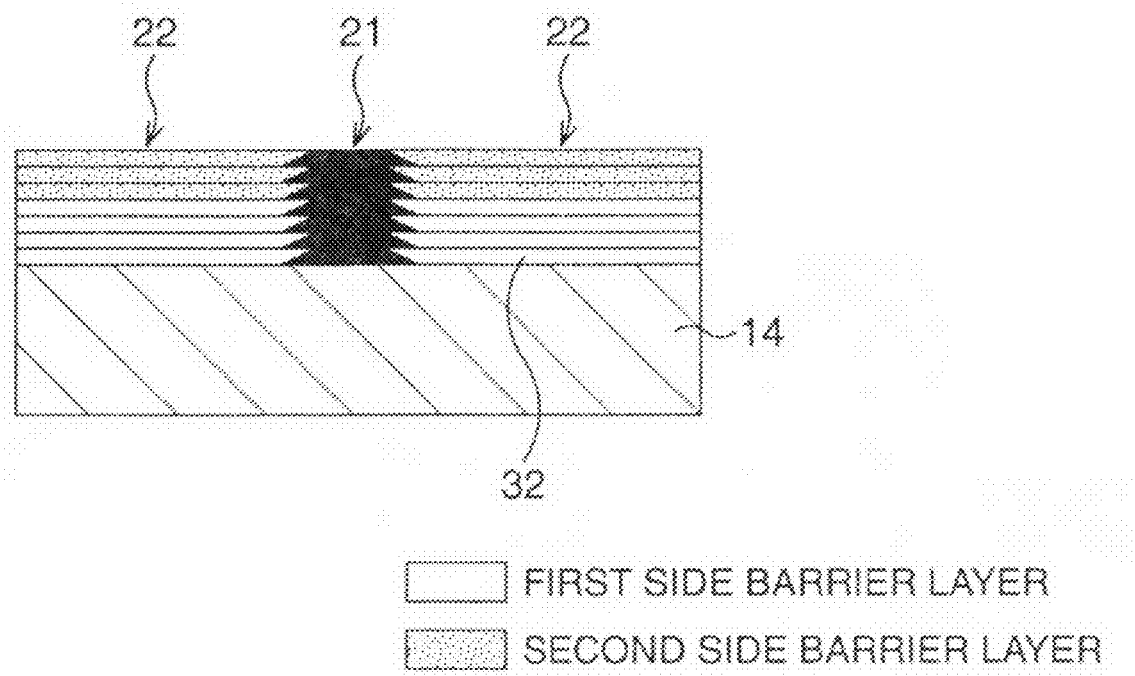
FIG. 12 is a schematic sectional view subsequent to FIG. 11C, showing the manufacturing method of the optical semiconductor device according to the first embodiment.

Here, a method of forming each of the quantum structures 13 of the stacked structure 10 will be described in detail using FIG. 12. In FIG. 12, as in FIG. 3 or the like, one columnar dot 21 and its periphery are shown in an enlarged form.

Each of the quantum structures 13 includes the columnar dot 21 and the side barrier 22 embedded between the adjacent columnar dots 21.

In this embodiment, the quantum dots 31 and the side barrier layers 32 are stacked in layers by appropriately repeating the following step a and step b.

(Step a)

First, the quantum dot 31 is formed. To put it in detail, the quantum dot is self-formed in the form of an island by being grown due to lattice mismatch with InP composing the semiconductor substrate 1, for example, by the MBE method, the MOVPE method, or the like. Thus, plural quantum dots 31 made of InAs are formed in parallel on the lower barrier 11.

Then, the side barrier layer 32 is formed. To put it in detail, the side barrier layer 32, for example, with a thickness of about 2 nm such that the quantum dot 31 is not embedded therein, for example, by the MBE method, the MOVPE method, or the like. Here, the side barrier layer 32 is formed using a material, for example, InGaAsP whose composition is controlled such that the lattice constant is larger than that of InP composing the semiconductor substrate 1 so as to become the first side barrier layer into which the tensile strain is introduced.

(Step b)

First, the quantum dot 31 is formed in the same manner as in the former stage of the step a.

Then, the side barrier layer 32 is formed. To put it in detail, the side barrier layer 32, for example, with a thickness of about 2 nm such that the quantum dot 31 is not embedded therein, for example, by the MBE method, the MOVPE method, or the like. Here, the side barrier layer 32 is formed using a material, for example, InGaAsP with the same lattice constant as that of InP composing the semiconductor substrate 1 so as to become the second side barrier layer which has no strain therein.

In this embodiment, in forming layers composed of the quantum dots 31 and the side barrier layers 32, lower portions, here four layers of the undermost layer to the fourth layer from the bottom, are formed by fully performing the step a.

Upper portions, here three layers of the fifth layer to the uppermost layer from the bottom, are formed by fully performing the step b.

By performing the step a and the step b as just described, formed on the lower barrier 11 is the quantum structure 13 including the columnar dot 21 which is formed by stacking and directly combining seven layers of quantum dots 31 and the side barrier 22 which is formed by stacking the respective side barrier layers 32 corresponding to the respective quantum dots 31 so as to be embedded between the adjacent columnar dots 21.

Incidentally, here the case in which the columnar dot 21 is formed as a 7-fold columnar dot in which the quantum dots 31 are directly stacked in seven layers is shown as an example, but the columnar dot 21 may be formed by directly stacking the quantum dots 31, approximately, in eight to fourteen layers, for example, in ten layers.

FIG. 10B:

Then, the cladding layer 3 made of p-InP is formed while stacked on the stacked structure 10.

FIG. 10C:

The cladding layer 3 and the stacked structure 10 are patterned in the shape of a stripe by lithography and etching.

FIG. 11A:

Subsequently, an embedded layer 4 made of semi-insulating InP is formed in such a manner as to be embedded in both sides of the cladding layer 3 and the stacked structure 10 patterned in the shape of a stripe.

FIG. 11B:

Thereafter, a silicon oxide film 5 is formed on the cladding layer 3 and the embedded layer 4.

Then, an opening 5a to expose part of the surface of the cladding layer 3 is formed by patterning the silicon oxide film 5 by lithography and etching.

FIG. 11C:

Subsequently, a titanium (Ti) film, for example, with a thickness of about 100 nm and a platinum (Pt) film, for example, with a thickness of about 300 nm are deposited on the silicon oxide film 5 in such a manner as to be embedded in the opening 5a, for example, by an electron beam evaporation method.

Thereafter, using the titanium film and the platinum film as a seed, a gold (Au) film with a thickness of about 3 μm is deposited on the platinum film by a plating method.

Then, a stacked structure of Au/Pt/Ti is patterned in the shape of an electrode by lithography and etching to form an electrode 6 which is electrically connected to the cladding layer 3 via the opening 5a.

By undergoing the above-described steps, the optical semiconductor device according to this embodiment is completed.

Figure 13:
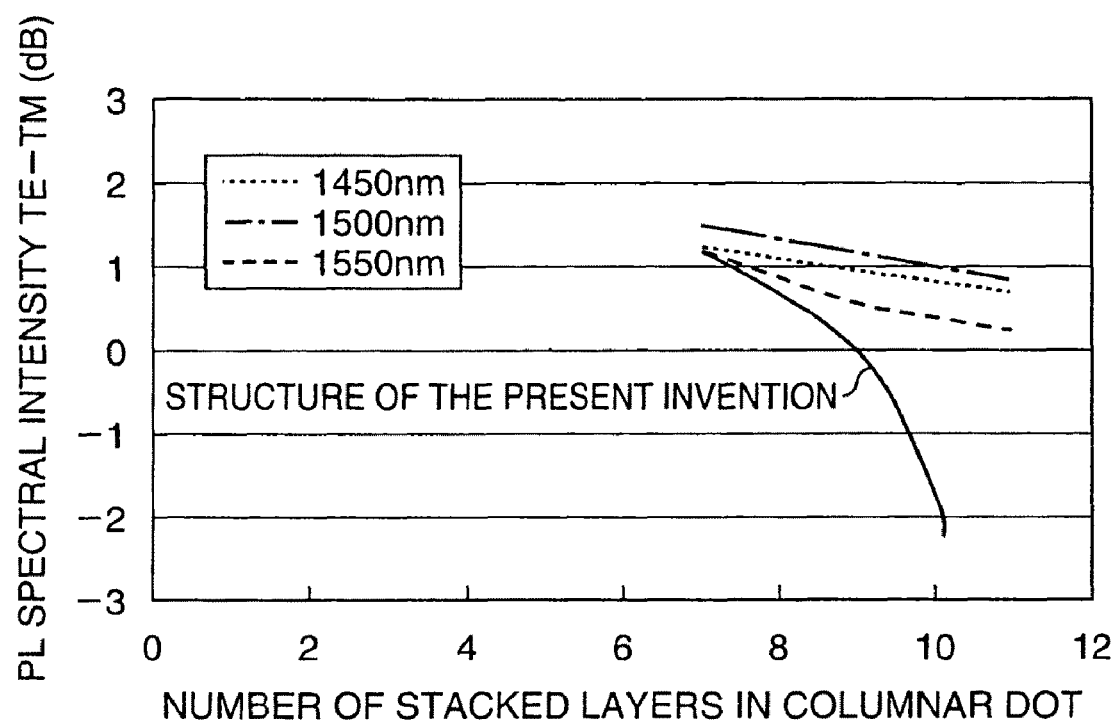
FIG. 13 is a characteristic chart showing an investigation result of polarization dependence of a columnar dot in this embodiment.

Now, the polarization dependence of the columnar dot in this embodiment is investigated as a relation between the number of stacked layers of quantum dots in the columnar dot and PL spectral intensity (luminous intensity of TE mode light-luminous intensity of TM mode light; dB) under a comparison with FIG. 21A. The result thereof is shown in FIG. 13.

Here, as the columnar dot 21 of this embodiment, the 10-fold columnar dot 21 formed by stacking the quantum dots 31 in ten layers is investigated. As a result, the value of the luminous intensity of the TM mode light which is higher than that of the luminous intensity of the TE mode light by 2 dB is obtained. By adopting this columnar dot 21 in the optical semiconductor device (optical semiconductor amplifier), a polarization-independent optical amplification characteristic can be obtained.

As described above, according to this embodiment, a reliable optical semiconductor device which easily and surely enables optical amplification with a high luminous intensity of TM mode light and no polarization dependence is realized.

MODIFIED EXAMPLES

Now, various modified examples of the first embodiment will be described.

Modified Example 1

In a modified example 1, the optical semiconductor device including the active layer 2 in the constitutional example (2) of the basic constitution 1 will be described.

Figure 14A:
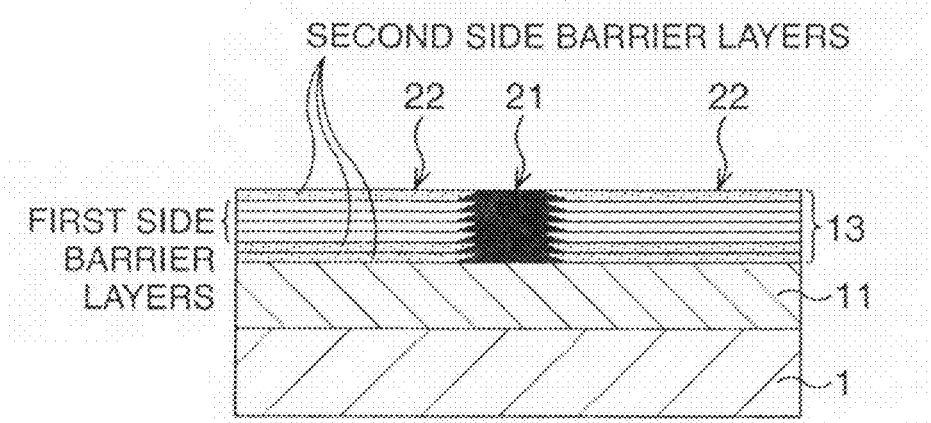
FIG. 14A and FIG. 14B are schematic sectional views showing main steps of a manufacturing method of an optical semiconductor device according to a modified example 1 of the first embodiment step by step.
Figure 14B:
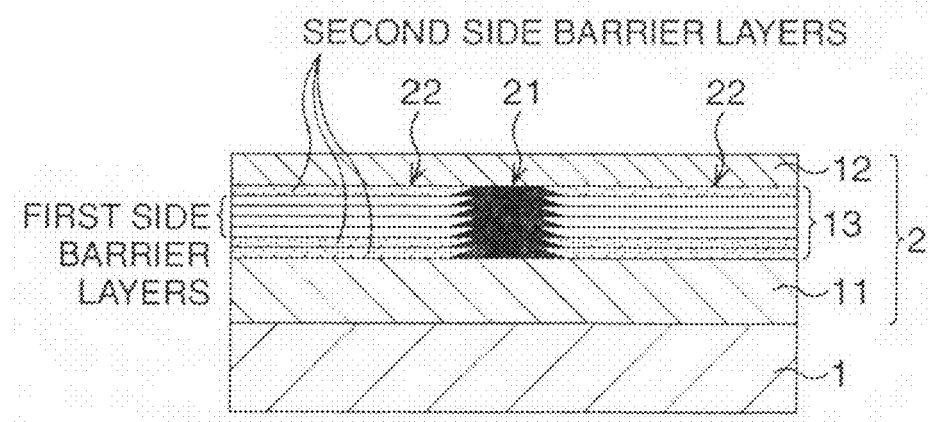

FIG. 14A and FIG. 14B are schematic sectional views showing main steps of a manufacturing method of the optical semiconductor device according to the modified example 1 of the first embodiment step by step.

Figure 10A:
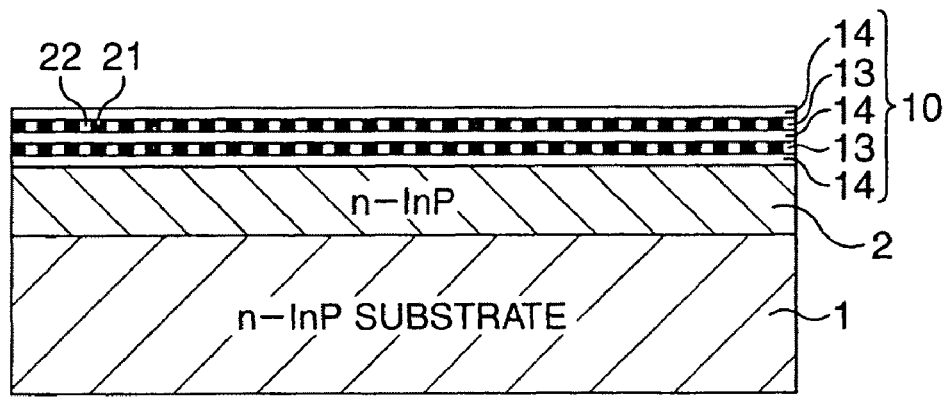
FIG. 10A to FIG. 10C are schematic sectional views showing a manufacturing method of an optical semiconductor device according to a first embodiment step by step.
Figure 10B:
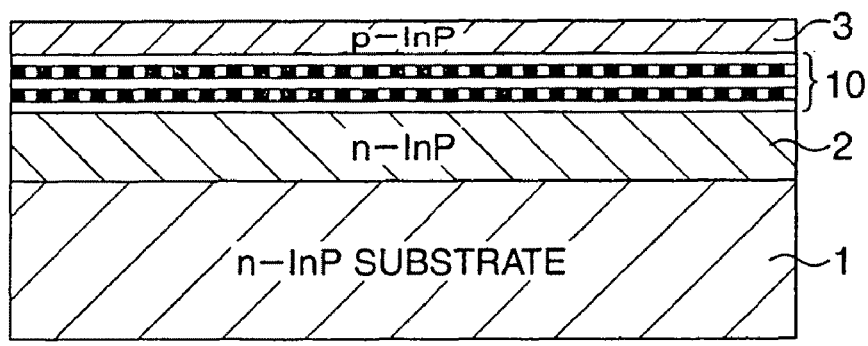
Figure 10C:
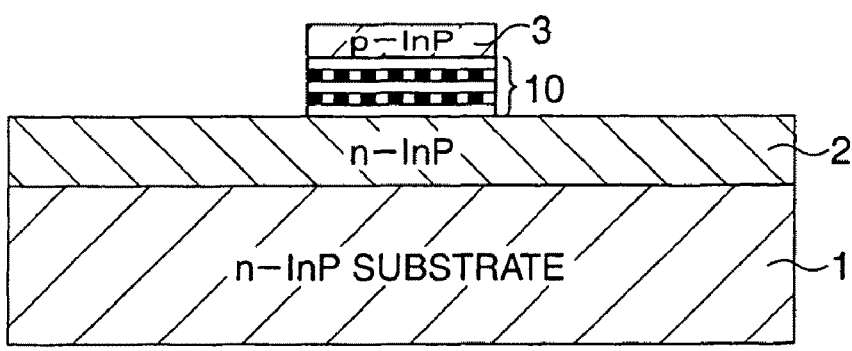
Figure 11A:
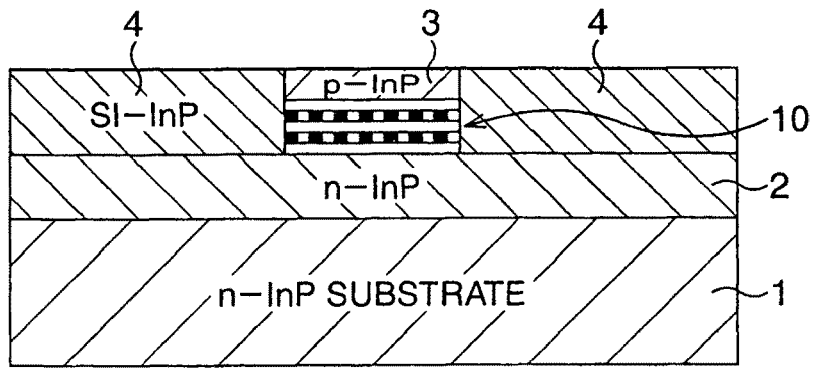
FIG. 11A to FIG. 11C are schematic sectional views subsequent to FIG. 10C, showing the manufacturing method of the optical semiconductor device according to the first embodiment.
Figure 11B:
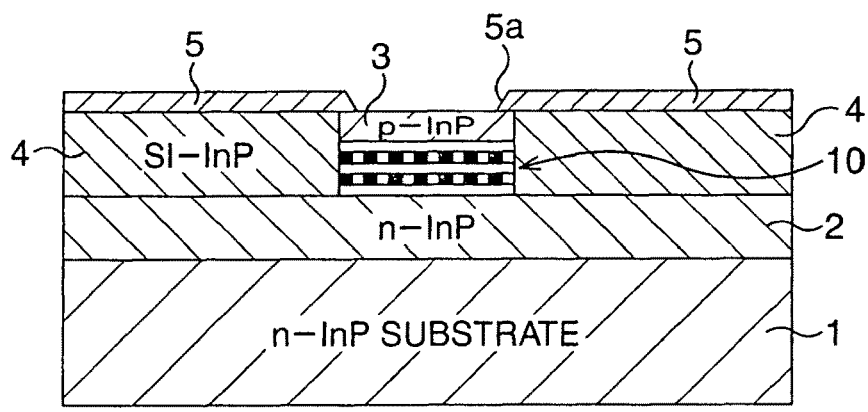
Figure 11C:
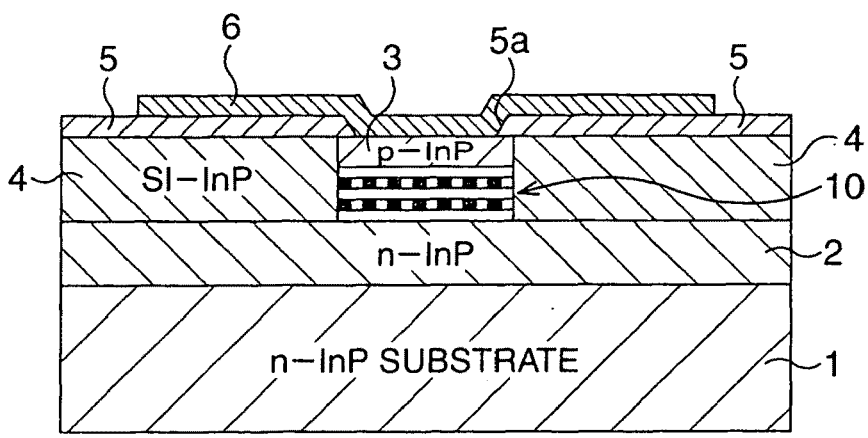

FIG. 14A:

In this example, first, the lower barrier 11 is formed in the same manner as in FIG. 10A of the first embodiment.

Then, the quantum structure 13 including the columnar dot 21 and the side barrier 22 embedded between the adjacent columnar dots 21 is formed on the lower barrier 11.

In this example, the quantum dots 31 and the side barrier layers 32 are stacked in layers by appropriately repeating the step a and the step b described in the first embodiment in the following manner.

In forming layers composed of the quantum dots 31 and the side barrier layers 32, three layers of the undermost layer to the second layer and the uppermost layer from the bottom are formed by fully performing the step b.

The remaining portions, that is, four layers of the third layer to the sixth layer from the bottom, are formed by fully performing the step a.

By performing the step a and the step b as just described, formed on the lower barrier 11 is the quantum structure 13 including the columnar dot 21 which is formed by stacking and directly combining seven layers of quantum dots 31 and the side barrier 22 which is formed by stacking the respective side barrier layers 32 corresponding to the respective quantum dots 31 so as to be embedded between the adjacent columnar dots 21.

Incidentally, here the case in which the columnar dot 21 is formed as a 7-fold columnar dot in which the quantum dots 31 are directly stacked in seven layers is shown as an example, but the columnar dot 21 may be formed by directly stacking the quantum dots 31, approximately, in eight to fourteen layers, for example, in ten layers.

FIG. 14B:

Then, the upper barrier 12, for example, made of InGaAsP with a thickness of about 40 nm is formed on the quantum structure 13, for example, by the MBE method, the MOVPE method, or the like. Thus, the active layer 2 formed by sandwiching the quantum structure 13 between the lower barrier 11 and the upper barrier 12 is formed on the semiconductor substrate 1.

Subsequently, the optical semiconductor device according to the modified example 1 is completed through respective steps in FIG. 10C, FIG. 11A, FIG. 11B, FIG. 12A, and FIG. 12B of the first embodiment.

As described above, according to the modified example 1, a highly reliable optical semiconductor device which easily and surely enables optical amplification with a high luminous intensity of TM mode light and no polarization dependence is realized.

Modified Example 2

In a modified example 2, the optical semiconductor device including the active layer 2 in the constitutional example (3) of the basic constitution 1 will be described.

Figure 15A:
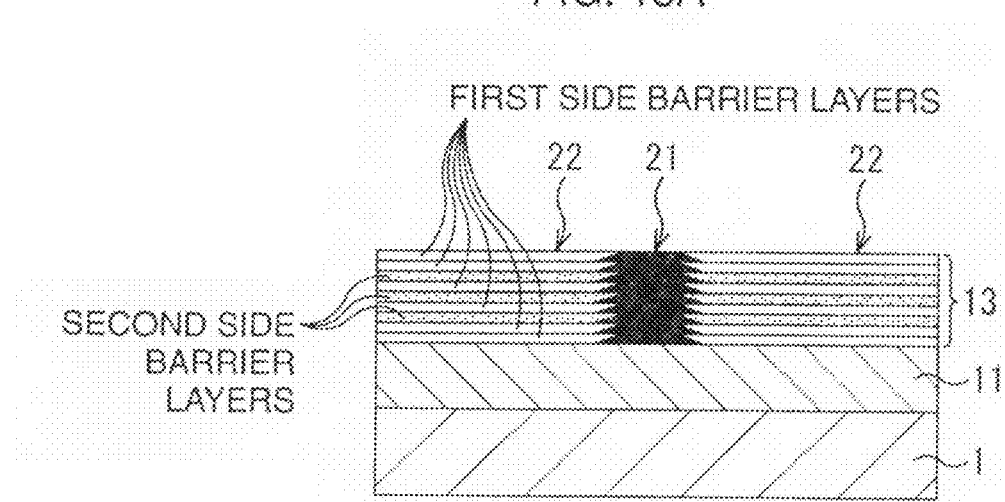
FIG. 15A and FIG. 15B are schematic sectional views showing main steps of a manufacturing method of an optical semiconductor device according to a modified example 2 of the first embodiment step by step.
Figure 15B:
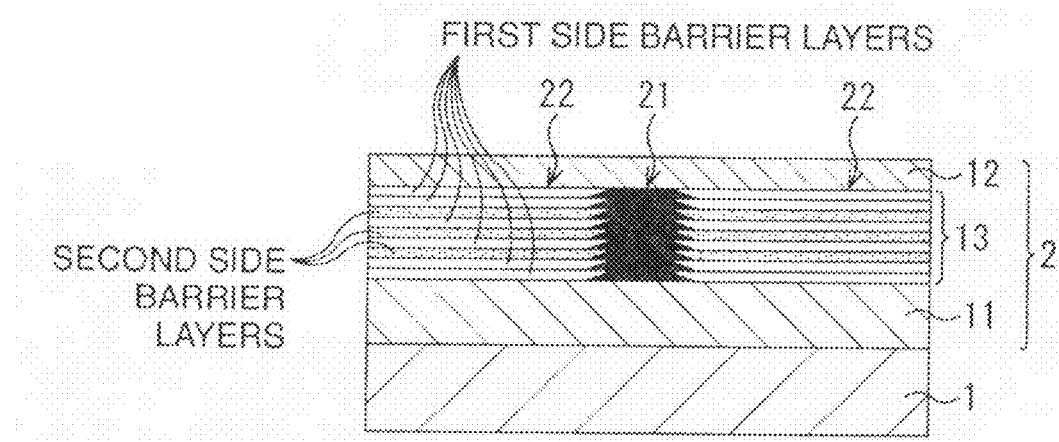

FIG. 15A and FIG. 15B are schematic sectional views showing main steps of a manufacturing method of the optical semiconductor device according to the modified example 2 of the first embodiment step by step.

FIG. 15A:

In this example, first, the lower barrier 11 is formed in the same manner as in FIG. 10A of the first embodiment.

Then, the quantum structure 13 including the columnar dot 21 and the side barrier 22 embedded between the adjacent columnar dots 21 is formed on the lower barrier 11.

In this example, the quantum dots 31 and the side barrier layers 32 are stacked in layers by appropriately repeating the step a and the step b described in the first embodiment in the following manner.

In forming layers composed of the quantum dots 31 and the side barrier layers 32, six layers of the undermost layer, the second layer, the fourth layer, the sixth layer, the eighth layer, and the uppermost layer from the bottom are formed by fully performing the step a.

The remaining portions, that is, three layers of the third layer, the fifth layer, and the seventh layer from the bottom, are formed by fully performing the step b.

By performing the step a and the step b as just described, formed on the lower barrier 11 is the quantum structure 13 including the columnar dot 21 which is formed by stacking and directly combining nine layers of quantum dots 31 and the side barrier 22 which is formed by stacking the respective side barrier layers 32 corresponding to the respective quantum dots 31 so as to be embedded between the adjacent columnar dots 21.

Incidentally, here the case in which the columnar dot 21 is formed as a 9-fold columnar dot in which the quantum dots 31 are directly stacked in nine layers is shown as an example, but the columnar dot 21 may be formed by directly stacking the quantum dots 31, approximately, in ten to fourteen layers, for example, in ten layers.

FIG. 15B:

Then, the upper barrier 12, for example, made of InGaAsP with a thickness of about 30 nm is formed on the quantum structure 13, for example, by the MBE method, the MOVPE method, or the like. Thus, the active layer 2 formed by sandwiching the quantum structure 13 between the lower barrier 11 and the upper barrier 12 is formed on the semiconductor substrate 1.

Subsequently, the optical semiconductor device according to the modified example 2 is completed through respective steps in FIG. 10C, FIG. 11A, FIG. 11B, FIG. 12A, and FIG. 12B of the first embodiment.

As described above, according to the modified example 2, a highly reliable optical semiconductor device which easily and surely enables optical amplification with a high luminous intensity of TM mode light and no polarization dependence is realized.

Modified Example 3

In a modified example 3, the optical semiconductor device including the active layer 2 in the constitutional example (4) of the basic constitution 1 will be described.

Figure 16A:
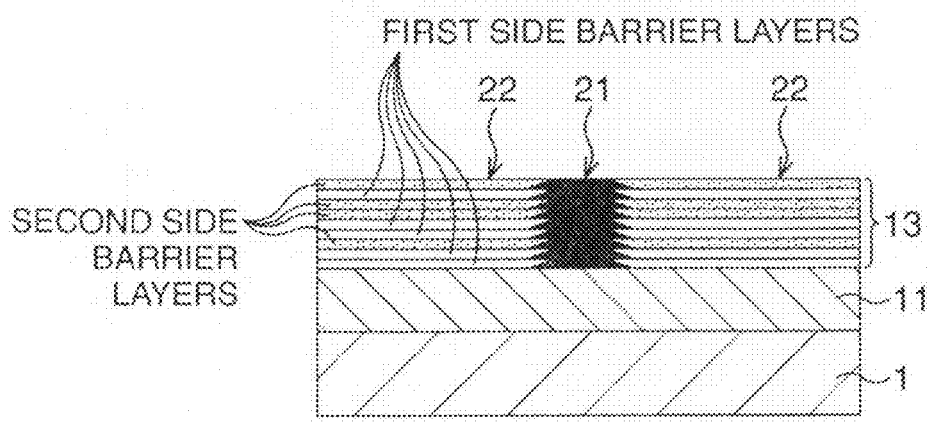
FIG. 16A and FIG. 16B are schematic sectional views showing main steps of a manufacturing method of an optical semiconductor device according to a modified example 3 of the first embodiment step by step.
Figure 16B:
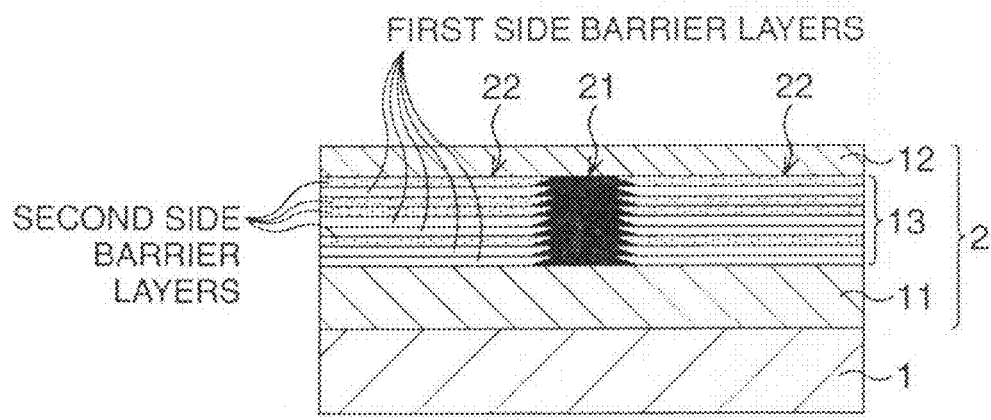

FIG. 16A and FIG. 16B are schematic sectional views showing main steps of a manufacturing method of the optical semiconductor device according to the modified example 3 of the first embodiment step by step.

FIG. 16A:

In this example, first, the lower barrier 11 is formed in the same manner as in FIG. 10A of the first embodiment.

Then, the quantum structure 13 including the columnar dot 21 and the side barrier 22 embedded between the adjacent columnar dots 21 is formed on the lower barrier 11.

In this example, the quantum dots 31 and the side barrier layers 32 are stacked in layers by appropriately repeating the step a and the step b described in the first embodiment in the following manner.

In forming layers composed of the quantum dots 31 and the side barrier layers 32, five layers of the undermost layer, the second layer, the fourth layer, the fifth layer, and the eighth layer from the bottom are formed by fully performing the step a.

The remaining portions, that is, four layers of the third layer, the sixth layer, the seventh layer, and the uppermost layer from the bottom, are formed by fully performing the step b.

By performing the step a and the step b as just described, formed on the lower barrier 11 is the quantum structure 13 including the columnar dot 21 which is formed by stacking and directly combining nine layers of quantum dots 31 and the side barrier 22 which is formed by stacking respective side barrier layers 32 corresponding to the respective quantum dots 31 so as to be embedded between the adjacent columnar dots 21.

Incidentally, here the case in which the columnar dot 21 is formed as a 9-fold columnar dot in which the quantum dots 31 are directly stacked in nine layers is shown as an example, but the columnar dot 21 may be formed by directly stacking the quantum dots 31, approximately, in ten to fourteen layers, for example, in ten layers.

FIG. 16B:

Then, the upper barrier 12, for example, made of InGaAsP with a thickness of about 30 nm is formed on the quantum structure 13, for example, by the MBE method, the MOVPE method, or the like. Thus, the active layer 2 formed by sandwiching the quantum structure 13 between the lower barrier 11 and the upper barrier 12 is formed on the semiconductor substrate 1.

Subsequently, the optical semiconductor device according to the modified example 3 is completed through respective steps in FIG. 10C, FIG. 11A, FIG. 11B, FIG. 12A, and FIG. 12B of the first embodiment.

As described above, according to the modified example 3, a highly reliable optical semiconductor device which easily and surely enables optical amplification with a high luminous intensity of TM mode light and no polarization dependence is realized.

Modified Example 4

In a modified example 4, the optical semiconductor device including the active layer 2 in the constitutional example (5) of the basic constitution 1 will be described.

Figure 17A:
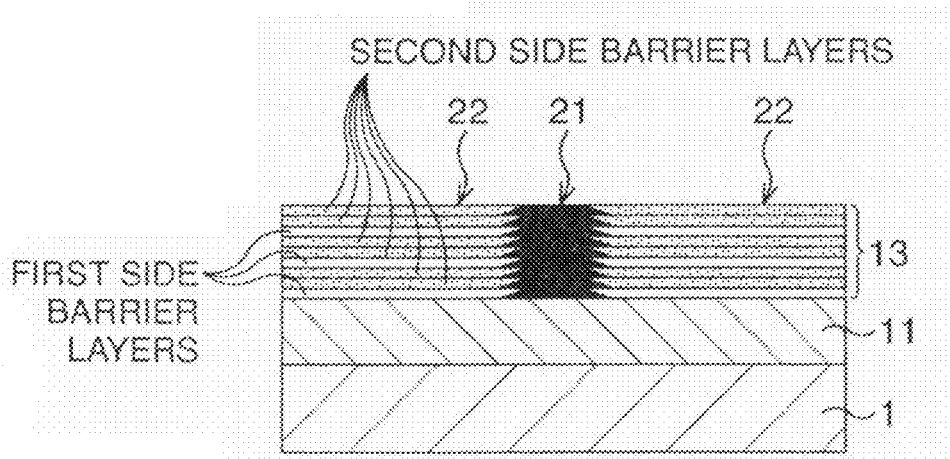
FIG. 17A and FIG. 17B are schematic sectional views showing main steps of a manufacturing method of an optical semiconductor device according to a modified example 4 of the first embodiment step by step.
Figure 17B:
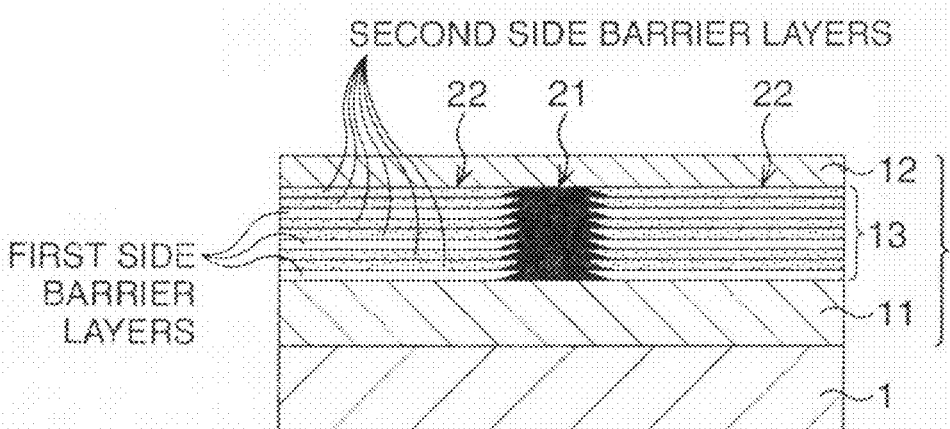

FIG. 17A and FIG. 17B are schematic sectional views showing main steps of a manufacturing method of the optical semiconductor device according to the modified example 4 of the first embodiment step by step.

FIG. 17A:

In this example, first, the lower barrier 11 is formed in the same manner as in FIG. 10A of the first embodiment.

Then, the quantum structure 13 including the columnar dot 21 and the side barrier 22 embedded between the adjacent columnar dots 21 is formed on the lower barrier 11.

In this example, the quantum dots 31 and the side barrier layers 32 are stacked in layers by appropriately performing steps a1 to a3 and the step b described in the first embodiment in the following manner.

(Step a1)

First, the quantum dot 31 is formed in the same manner as in the former stage of the step a in the first embodiment.

Then, the side barrier layer 32 is formed. To put it in detail, the side barrier layer 32, for example, with a thickness of about 2 nm such that the quantum dot 31 is not embedded therein, for example, by the MBE method, the MOVPE method, or the like. Here, the side barrier layer 32 is formed using a material, for example, InGaAsP which has a lattice constant larger than InP composing the semiconductor substrate 1 and whose composition is controlled so that the lattice constant becomes the largest in the modified example 4 so as to become the first side barrier layer into which the tensile strain is introduced.

(Step a2)

First, the quantum dot 31 is formed in the same manner as in the former stage of the step a in the first embodiment.

Then, the side barrier layer 32 is formed. To put it in detail, the side barrier layer 32, for example, with a thickness of about 2 nm such that the quantum dot 31 is not embedded therein, for example, by the MBE method, the MOVPE method, or the like. Here, the side barrier layer 32 is formed using a material, for example, InGaAsP whose composition is controlled such that the lattice constant is larger than that of InP composing the semiconductor substrate 1 and smaller than that of InP in the step a1 so as to become the first side barrier layer into which the tensile strain is introduced.

(Step a3)

First, the quantum dot 31 is formed in the same manner as in the former stage of the step a in the first embodiment.

Then, the side barrier layer 32 is formed. To put it in detail, the side barrier layer 32, for example, with a thickness of about 2 nm such that the quantum dot 31 is not embedded therein, for example, by the MBE method, the MOVPE method, or the like. Here, the side barrier layer 32 is formed using a material, for example, InGaAsP whose composition is controlled such that the lattice constant is larger than that of InP composing the semiconductor substrate 1 and smaller than that of InP in the step a2 so as to become the first side barrier layer into which the tensile strain is introduced.

In this embodiment, in forming layers composed of the quantum dots 31 and the side barrier layers 32, the undermost layer, the fourth layer from the bottom, and the seventh layer from the bottom are formed by performing the step a1, the step a2, and the step a3, respectively.

The remaining portions, that is, six layers of the second layer, the third layer, the fifth layer, the sixth layer, the eighth layer, and the uppermost layer from the bottom, are formed by fully performing the step b.

Formed by performing the steps a1 to a3 and the step b as just described is the quantum structure 13 including the columnar dot 21 which is formed by stacking and directly combining nine layers of quantum dots 31 and the side barrier 22 which is formed by stacking the respective side barrier layers 32 corresponding to the respective quantum dots 31 so as to be embedded between the adjacent columnar dots 21.

Incidentally, here the case in which the columnar dot 21 is formed as a 9-fold columnar dot in which the quantum dots 31 are directly stacked in nine layers is shown as an example, but the columnar dot 21 may be formed by directly stacking the quantum dots 31, approximately, in ten to fourteen layers, for example, in ten layers.

FIG. 17B:

Then, the upper barrier 12, for example, made of InGaAsP with a thickness of about 30 nm is formed on the quantum structure 13, for example, by the MBE method, the MOVPE method, or the like. Thus, the active layer 2 formed by sandwiching the quantum structure 13 between the lower barrier 11 and the upper barrier 12 is formed on the semiconductor substrate 1.

Subsequently, the optical semiconductor device according to the modified example 4 is completed through respective steps in FIG. 10C, FIG. 11A, FIG. 11B, FIG. 12A, and FIG. 12B of the first embodiment.

As described above, according to the modified example 4, a highly reliable optical semiconductor device which easily and surely enables optical amplification with a high luminous intensity of TM mode light and no polarization dependence is realized.

Second Embodiment

In this embodiment, the optical semiconductor device including the active layer 2 in the constitutional example (1) of the basic constitution 2 will be described.

Figure 18A:
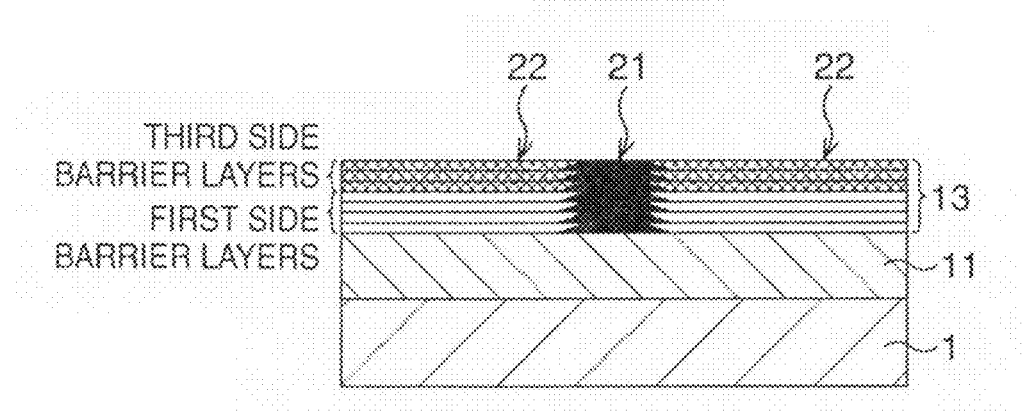
FIG. 18A and FIG. 18B are schematic sectional views showing main steps of a manufacturing method of an optical semiconductor device according to a second embodiment step by step.
Figure 18B:
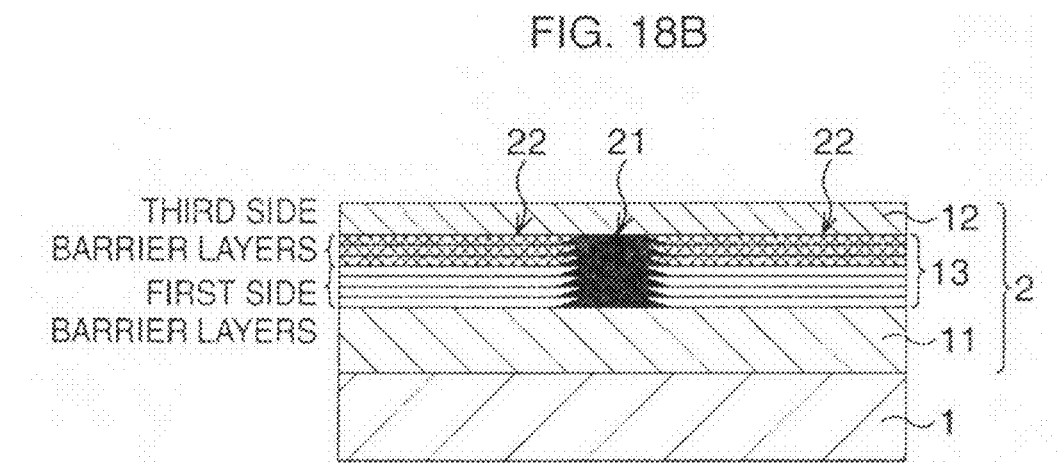

FIG. 18A and FIG. 18B are schematic sectional views showing main steps of a manufacturing method of the optical semiconductor device according to the second embodiment step by step.

FIG. 18A:

In this example, first, the lower barrier 11 is formed in the same manner as in FIG. 10A of the first embodiment.

Then, the quantum structure 13 including the columnar dot 21 and the side barrier 22 embedded between the adjacent columnar dots 21 is formed on the lower barrier 11.

In this example, the quantum dots 31 and the side barrier layers 32 are stacked in layers by appropriately repeating the step a described in the first embodiment and a step c in the following manner.

(Step c)

First, the quantum dot 31 is formed in the same manner as in the former stage of the step a in the first embodiment.

Then, the side barrier layer 32 is formed. To put it in detail, the side barrier layer 32, for example, with a thickness of about 2 nm such that the quantum dot 31 is not embedded therein, for example, by the MBE method, the MOVPE method, or the like. Here, the side barrier layer 32 is formed using a material, for example, InGaAsP whose composition is controlled such that the lattice constant is larger than that of InP composing the semiconductor substrate 1 so as to become the third side barrier layer into which the compressive strain is introduced.

In this embodiment, in forming layers composed of the quantum dots 31 and the side barrier layers 32, lower portions, here four layers of the undermost layer to the fourth layer from the bottom, are formed by fully performing the step a.

Upper portions, here three layers of the fifth layer to the uppermost layer from the bottom, are formed by fully performing the step c.

Formed by performing the step a and the step c as just described is the quantum structure 13 including the columnar dot 21 which is formed by stacking and directly combining seven layers of quantum dots 31 and the side barrier 22 which is formed by stacking the respective side barrier layers 32 corresponding to the respective quantum dots 31 so as to be embedded between the adjacent columnar dots 21.

Incidentally, here the case in which the columnar dot 21 is formed as a 7-fold columnar dot in which the quantum dots 31 are directly stacked in seven layers is shown as an example, but the columnar dot 21 may be formed by directly stacking the quantum dots 31, approximately, in eight to fourteen layers, for example, in ten layers.

FIG. 18B:

Then, the upper barrier 12, for example, made of InGaAsP with a thickness of about 30 nm is formed on the quantum structure 13, for example, by the MBE method, the MOVPE method, or the like. Thus, the active layer 2 formed by sandwiching the quantum structure 13 between the lower barrier 11 and the upper barrier 12 is formed on the semiconductor substrate 1.

Subsequently, the optical semiconductor device according to the second embodiment is completed through respective steps in FIG. 10C, FIG. 11A, FIG. 11B, FIG. 12A, and FIG. 12B of the first embodiment.

As described above, according to the second embodiment, a highly reliable optical semiconductor device which easily and surely enables optical amplification with a high luminous intensity of TM mode light and no polarization dependence is realized.

Modified Example

Now, a modified example of the second embodiment will be described.

In this modified example, the optical semiconductor device including the active layer 2 in the constitutional example (2) of the basic constitution 2 will be described.

Figure 19A:
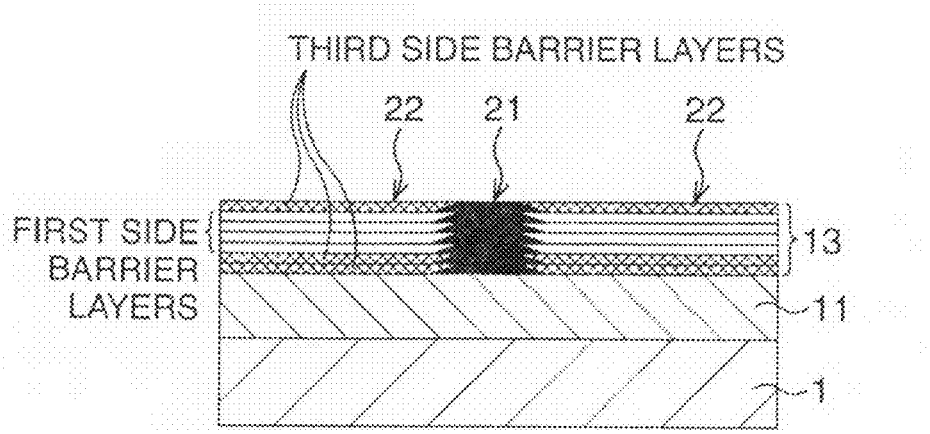
FIG. 19A and FIG. 19B are schematic sectional views showing main steps of a manufacturing method of an optical semiconductor device according to a modified example 1 of the second embodiment step by step.
Figure 19B:
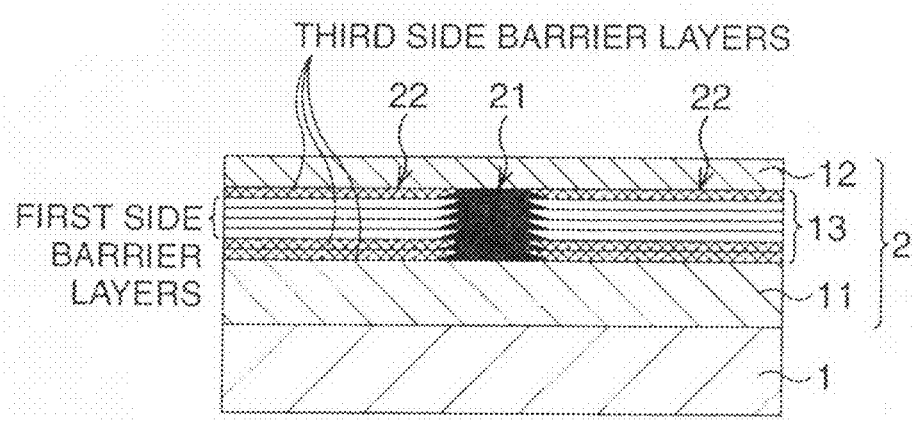
Figure 20:
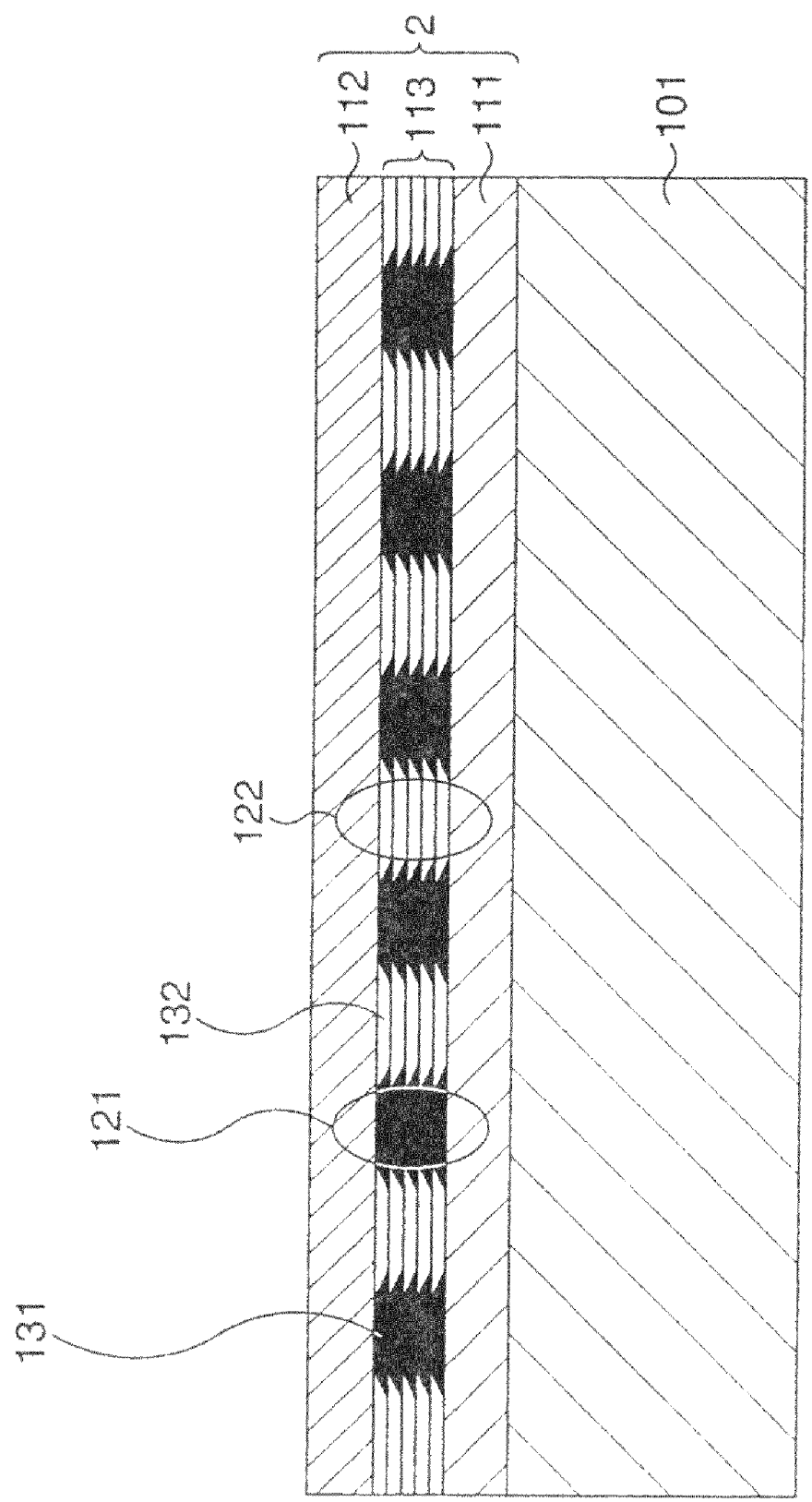
FIG. 20 is a schematic sectional view showing columnar dots in a conventional optical semiconductor device.

FIG. 19A and FIG. 19B are schematic sectional views showing main steps of a manufacturing method of the optical semiconductor device according to the modified example of the second embodiment step by step.

FIG. 19A:

In this example, first, the lower barrier 11 is formed in the same manner as in FIG. 10A of the first embodiment.

Then, the quantum structure 13 including the columnar dot 21 and the side barrier 22 embedded between the adjacent columnar dots 21 is formed on the lower barrier 11.

In this example, the quantum dots 31 and the side barrier layers 32 are stacked in layers by appropriately repeating the step a and the step c described in the second embodiment in the following manner.

In forming layers composed of the quantum dots 31 and the side barrier layers 32, three layers of the undermost layer to the second layer and the uppermost layer from the bottom are formed by fully performing the step c.

The remaining portions, that is, four layers of the third layer to the sixth layer from the bottom, are formed by fully performing the step a.

By performing the step a and the step c as just described, formed on the lower barrier 11 is the quantum structure 13 including the columnar dot 21 which is formed by stacking directly combining and seven layers of quantum dots 31 and the side barrier 22 which is formed by stacking the respective side barrier layers 32 corresponding to the respective quantum dots 31 so as to be embedded between the adjacent columnar dots 21.

Incidentally, here the case in which the columnar dot 21 is formed as a 7-fold columnar dot in which the quantum dots 31 are directly stacked in seven layers is shown as an example, but the columnar dot 21 may be formed by directly stacking the quantum dots 31, approximately, in eight to fourteen layers, for example, in ten layers.

FIG. 19B:

Then, the upper barrier 12, for example, made of InGaAsP with a thickness of about 30 nm is formed on the quantum structure 13, for example, by the MBE method, the MOVPE method, or the like. Thus, the active layer 2 formed by sandwiching the quantum structure 13 between the lower barrier 11 and the upper barrier 12 is formed on the semiconductor substrate 1.

Subsequently, the optical semiconductor device according to the modified example is completed through respective steps in FIG. 10C, FIG. 11A, FIG. 11B, FIG. 12A, and FIG. 12B of the first embodiment.

As described above, according to the modified example, a highly reliable optical semiconductor device which easily and surely enables optical amplification with a high luminous intensity of TM mode light and no polarization dependence is realized.

According to the present invention, an optical semiconductor device which easily and surely enables optical amplification with a high luminous intensity of TM mode light and no polarization dependence is realized.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. An optical semiconductor device, comprising:
a semiconductor substrate; and
an active layer including a quantum structure, which is formed on said semiconductor substrate, wherein
the quantum structure comprises:
a columnar dot which is formed by stacking in layers, growing, and directly combining a plurality of quantum dots; and
a side barrier which is formed by stacking respective side barrier layers corresponding to the respective quantum dots so as to be embedded between a plurality of said columnar dots adjacent to each other, and
said side barrier is formed so that part of a plurality of the side barrier layers is a first side barrier layer having a lattice constant smaller than a lattice constant of said semiconductor substrate and the other part is a second side barrier layer having a lattice constant larger than the lattice constant of said semiconductor substrate into which compressive strain is introduced.

2. The optical semiconductor device according to claim 1, wherein in said side barrier, a lower structure is formed by stacking a plurality of the first side barrier layers, and an upper structure is formed by stacking a plurality of the third second side barrier layers on the lower structure.

* * * * *